(12) United States Patent
Hosono et al.

(10) Patent No.: US 11,094,909 B2
(45) Date of Patent: Aug. 17, 2021

(54) THIN FILM OF METAL OXIDE, ORGANIC ELECTROLUMINESCENT DEVICE INCLUDING THE THIN FILM, PHOTOVOLTAIC CELL INCLUDING THE THIN FILM AND ORGANIC PHOTOVOLTAIC CELL INCLUDING THE THIN FILM

(71) Applicant: JAPAN SCIENCE AND TECHNOLOGY AGENCY, Kawaguchi (JP)

(72) Inventors: Hideo Hosono, Meguro-ku (JP); Yoshitake Toda, Meguro-ku (JP); Toshinari Watanabe, Chiyoda-ku (JP); Naomichi Miyakawa, Chiyoda-ku (JP); Kazuhiro Ito, Chiyoda-ku (JP); Satoru Watanabe, Chiyoda-ku (JP); Akira Mitsui, Chiyoda-ku (JP); Kazuto Ohkoshi, Chiyoda-ku (JP)

(73) Assignee: JAPAN SCIENCE AND TECHNOLOGY AGENCY, Kawaguchi (JP)

( * ) Notice: Subject to any disclaimer, the term of this patent is extended or adjusted under 35 U.S.C. 154(b) by 328 days.

(21) Appl. No.: 15/178,828

(22) Filed: Jun. 10, 2016

(65) Prior Publication Data

US 2016/0285027 A1    Sep. 29, 2016

Related U.S. Application Data

(63) Continuation of application No. PCT/JP2014/082155, filed on Dec. 4, 2014.

(30) Foreign Application Priority Data

Dec. 26, 2013 (JP) .............................. JP2013-268343
Sep. 18, 2014 (JP) .............................. JP2014-190362

(51) Int. Cl.
*H01L 51/50* (2006.01)
*H01L 51/44* (2006.01)
(Continued)

(52) U.S. Cl.
CPC ...... *H01L 51/5072* (2013.01); *H01L 51/4273* (2013.01); *H01L 51/5092* (2013.01);
(Continued)

(58) Field of Classification Search
None
See application file for complete search history.

(56) References Cited

U.S. PATENT DOCUMENTS 5,631,664 A    5/1997 Adachi et al.
6,198,219 B1   3/2001 Arai et al.
(Continued)

FOREIGN PATENT DOCUMENTS

CN    102576577 A    7/2012
CN    102687302 A    9/2012
(Continued)

OTHER PUBLICATIONS

Machine English translation of Yamaguchi et al. (JP 2013-189657 A). Apr. 28, 2018.*

(Continued)

*Primary Examiner* — Jay Yang
(74) *Attorney, Agent, or Firm* — Oblon, McClelland, Maier & Neustadt, L.L.P.

(57) ABSTRACT

A thin film of amorphous metal oxide includes zinc (Zn), silicon (Si) and oxygen (O), the atomic ratio of Zn/(Zn+Si) being 0.30 to 0.95.

26 Claims, 14 Drawing Sheets

(51) Int. Cl.
*H01L 51/42* (2006.01)
*H01L 51/00* (2006.01)

(52) U.S. Cl.
CPC ...... *H01L 51/5096* (2013.01); *H01L 51/0081* (2013.01); *H01L 51/0085* (2013.01); *H01L 51/44* (2013.01); *H01L 2251/303* (2013.01); *H01L 2251/5353* (2013.01); *Y02E 10/549* (2013.01)

(56) References Cited

U.S. PATENT DOCUMENTS

| | | | |
|---|---|---|---|
| 2001/0003601 A1* | 6/2001 | Ueda | H01L 51/5206 427/64 |
| 2003/0048072 A1* | 3/2003 | Ishihara | H01L 51/5262 313/506 |
| 2005/0191519 A1* | 9/2005 | Mishima | C09K 11/06 428/690 |
| 2005/0208332 A1* | 9/2005 | Chin | C09K 11/06 428/690 |
| 2010/0194717 A1* | 8/2010 | Mori | H01L 51/5268 345/204 |
| 2010/0253607 A1* | 10/2010 | Shiozaki | H01L 27/3244 345/76 |
| 2011/0212570 A1* | 9/2011 | Yamazaki | H01L 29/66742 438/104 |
| 2012/0187389 A1 | 7/2012 | Shoda et al. | |
| 2012/0225250 A1 | 9/2012 | Kuznetsov et al. | |
| 2013/0009147 A1* | 1/2013 | Koyama | H01L 21/02422 257/43 |
| 2013/0119324 A1 | 5/2013 | Morita et al. | |
| 2014/0158951 A1 | 6/2014 | Yamanobe et al. | |
| 2015/0137103 A1 | 5/2015 | Hosono et al. | |

FOREIGN PATENT DOCUMENTS

| | | | |
|---|---|---|---|
| CN | 103038888 A | 4/2013 | |
| CN | 103380229 A | 10/2013 | |
| JP | 6-333675 | 12/1994 | |
| JP | 06333675 A * | 12/1994 | |
| JP | 2001-176667 | 6/2001 | |
| JP | 2001-176673 A | 6/2001 | |
| JP | 2004-292873 A | 10/2004 | |
| JP | 2006-245330 | 9/2006 | |
| JP | 2013-67531 A | 4/2013 | |
| JP | 2013189657 A * | 9/2013 | ............ C04B 35/16 |
| JP | 2014-55348 A | 3/2014 | |
| JP | 2014-141386 A | 8/2014 | |
| WO | WO 2012/041853 A2 | 4/2012 | |
| WO | WO 2012/114713 A1 | 8/2012 | |
| WO | WO-2013/042423 A1 * | 3/2013 | |
| WO | WO 2013/191212 A1 | 12/2013 | |
| WO | WO 2014/163116 A1 | 10/2014 | |

OTHER PUBLICATIONS

Machine English translation of Mihara (JP 07-333675 A). Sep. 28, 2018.*
International Search Report dated Mar. 3, 2015 in PCT/JP2014/082155, filed on Dec. 4, 2014 (with English Translation).
Written Opinion dated Mar. 3, 2015 in PCT/JP2014/082155, filed on Dec. 4, 2014.

* cited by examiner

THIN FILM OF METAL OXIDE, ORGANIC ELECTROLUMINESCENT DEVICE INCLUDING THE THIN FILM, PHOTOVOLTAIC CELL INCLUDING THE THIN FILM AND ORGANIC PHOTOVOLTAIC CELL INCLUDING THE THIN FILM

CROSS-REFERENCE TO RELATED APPLICATION

This application is a continuation application filed under 35 U.S.C. 111(a) claiming the benefit under 35 U.S.C. 120 and 365(c) of PCT International Application No. PCT/JP2014/082155 filed on Dec. 4, 2014, which is based upon and claims the benefit of priority of Japanese Priority Application No. 2013-268343 filed on Dec. 26, 2013, and Japanese Priority Application No. 2014-190362 filed on Sep. 18, 2014, and the entire contents of which are hereby incorporated by reference.

BACKGROUND OF THE INVENTION

1. Field of the Invention

The present invention relates to a thin film of metal oxide, an organic electroluminescent device including the thin film, a photovoltaic cell including the thin film and an organic photovoltaic cell including the thin film.

2. Description of the Related Art

Organic devices such as organic electroluminescent devices, organic photovoltaic cells or the like are widely developed. For example, the organic electroluminescent devices are widely used for displays, backlights, illuminations and the like.

Generally, an organic electroluminescent device includes two electrodes (an anode and a cathode) and an organic light emitting layer provided between these electrodes. When applying a voltage between the electrodes, holes and electrons are injected into the organic layer from the respective electrodes. When the holes and the electrons are recombined in the organic light emitting layer, binding energy is generated to excite organic luminescent materials in the organic light emitting layer. As light emissions occur when the excited luminescent materials return to the ground state, a luminescent (EL) device is obtained by using this phenomenon.

Here, generally, the organic electroluminescent device further includes a hole injection layer and/or a hole transport layer, and an electron injection layer and/or an electron transport layer. The hole injection layer and the hole transport layer are provided between the anode and the organic light emitting layer, and have a function to selectively inject holes into the organic light emitting layer. Further, the electron injection layer and the electron transport layer are provided between the cathode and the organic light emitting layer, and have a function to selectively inject electrons into the organic light emitting layer (Patent Document 1). It is known that the luminous efficiency of the organic electroluminescent device is increased by providing such layers.

Further, a general organic photovoltaic cell includes a pair of electrodes and an organic photoelectric conversion layer provided between the electrodes. In accordance with the injection of light, holes and electrons are generated in the organic photoelectric conversion layer. When these holes and the electrons are extracted from an electrode for extracting the holes and from an electrode for extracting the electrodes, respectively, electric power is generated. Further, when the organic photovoltaic cell functions as a photodetector, the light is converted to an electrical signal at the organic photoelectric conversion layer and the light is detected.

It is preferable for the organic photovoltaic cell as well that the electron injection layer and the electron transport layer are provided between the electrode for extracting the electrons and the organic photoelectric conversion layer. It is preferable that the hole injection layer and the hole transport layer are provided between the electrode for extracting holes and the organic photoelectric conversion layer. By providing such layers, the conversion efficiency of the organic photovoltaic cell can be increased. The above described organic photovoltaic cell is just an example and even for a photovoltaic cell including an inorganic photovoltaic cell, the conversion efficiency can be increased. Here, a cell in which an organic compound is used for optical absorption and current generation is referred to as an organic photovoltaic cell, and a cell in which an inorganic substance such as silicon or the like, an inorganic compound such as gallium arsenide or the like is used is referred to as an inorganic photovoltaic cell.

Patent Document

[Patent Document 1] Japanese Laid-open Patent Publication No. 2001-176667

However, characteristic of an organic device is still insufficient and it is required to improve performance of each layer member such as an electron transport layer or the like in order to improve the characteristic of the organic device. Thus, a layer member capable of improving the characteristic is required. In particular, organic substances having high electron mobility are not found for an organic electroluminescent device, and if the electron transport layer is formed to be thick, that directly causes rising of driving voltage of the device. Thus, it is difficult to expand the distance between the cathode and the light emitting layer. For the cathode, generally, a metal with a low work function such as aluminum or magnesium is often used. However, if the metal is positioned at near-field of the light emitting layer as such, optical loss is generated because Evanescent light (near-field light) and surface plasmon are coupled at a surface of the metal. Such loss causes a greatly reduced external quantum efficiency (a ratio of the number of photons emitted outside the organic electroluminescent device with respect to the number of electrons injected into the light emitting layer).

SUMMARY OF THE INVENTION

The present invention is made in light of the above problems, and one of the problems to be solved by the present invention is to provide a thin film with good electron transport capability. Further, one of the problems to be solved by the present invention is to provide an organic electroluminescent device having better stability with higher reliability compared with a conventional one. Further, one of the problems to be solved by the present invention is to provide a photovoltaic cell having better stability with higher reliability compared with a conventional one. Further, one of the problems to be solved by the present invention is to provide an organic photovoltaic cell having better stability with higher reliability compared with a conventional one.

The present invention provides a thin film of amorphous metal oxide containing zinc (Zn), silicon (Si) and oxygen (O), the atomic ratio of Zn/(Zn+Si) being 0.30 to 0.95.

Further, the present invention provides an organic electroluminescent device including the above described thin film.

Further, the present invention provides an organic photovoltaic cell including the above described thin film.

Further, the present invention provides a thin film of metal oxide containing zinc (Zn), silicon (Si) and oxygen (O), the atomic ratio of Zn/(Zn+Si) being 0.30 to 0.95.

Further, the present invention provides an organic electroluminescent device including the above described thin film.

Further, the present invention provides a photovoltaic cell including the above described thin film.

Further, the present invention provides an organic photovoltaic cell including the above described thin film.

According to the present invention, a thin film with good electron transport capability can be provided. Further, according to the present invention, an organic electroluminescent device having better stability with higher reliability compared with a conventional one can be provided. Further, according to the present invention, a photovoltaic cell having better stability with higher reliability compared with a conventional one can be provided. Further, according to the present invention, an organic photovoltaic cell having better stability with higher reliability compared with a conventional one can be provided.

BRIEF DESCRIPTION OF THE DRAWINGS

Other objects, features and advantages of the present invention will become more apparent from the following detailed description when read in conjunction with the accompanying drawings.

DETAILED DESCRIPTION OF THE PREFERRED EMBODIMENTS

Figure 1:
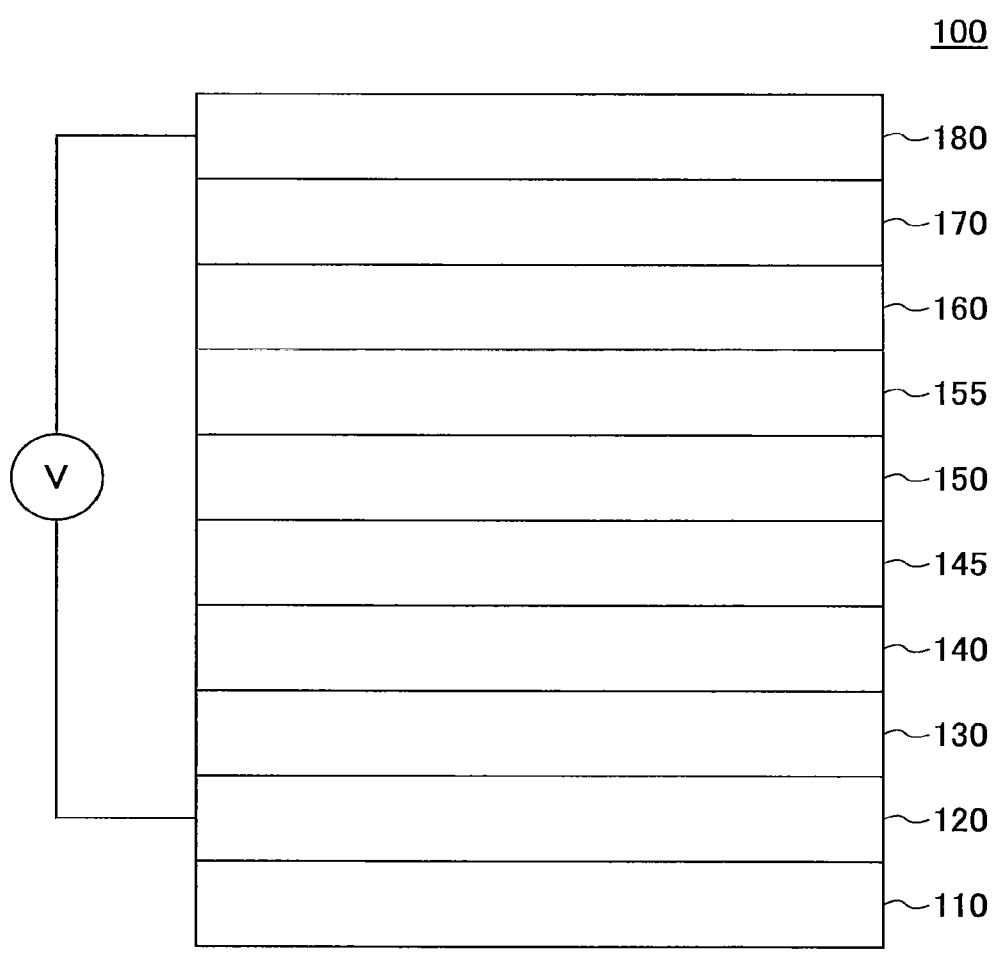
FIG. 1 is a cross-sectional view schematically illustrating a structure of an organic electroluminescent device of an example of the present invention.

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated.

In this specification, "amorphous metal oxide containing zinc (Zn), silicon (Si) and oxygen (O), the atomic ratio of Zn/(Zn+Si) being 0.30 to 0.95" is simply referred to as "amorphous metal oxide" as well.

Further, "a thin film of amorphous metal oxide containing zinc (Zn), silicon (Si) and oxygen (O), the atomic ratio of Zn/(Zn+Si) being 0.30 to 0.95" is simply referred to as "a thin film of amorphous metal oxide" as well.

(Thin Film of Amorphous Metal Oxide)

In an example of the invention, a thin film of amorphous metal oxide containing zinc (Zn), silicon (Si) and oxygen (O) in which the atomic ratio of Zn/(Zn+Si) is 0.30 to 0.95 is provided.

In an example of the invention, in the thin film of amorphous metal oxide, the atomic ratio of Zn/(Zn+Si) is greater than or equal to 0.30. Thus, sufficiently high electron mobility can be obtained and rising of the driving voltage of the organic device can be suppressed.

In the thin film of amorphous metal oxide, the atomic ratio of Zn/(Zn+Si) may be 0.70 to 0.94, may be 0.80 to 0.92, or may be 0.85 to 0.90.

It is preferable that the amorphous metal oxide has chemical composition expressed as $xZnO\text{-}(1\text{-}x)SiO_2$ (x=0.30 to 0.95), where "x" may be 0.70 to 0.94, may be 0.80 to 0.92, or may be 0.85 to 0.90. It is preferable that the amorphous metal oxide is multiple oxide.

It is preferable that the thin film of amorphous metal oxide is substantially composed of ZnO and $SiO_2$. However, the thin film of amorphous metal oxide may further contain one or more other metal components selected from a group consisting of tin (Sn), titanium (Ti), indium (In), gallium (Ga), niobium (Nb) and aluminum (Al). The content of the other metal components, in terms of an oxide, with respect to 100 mol %, which is the total of ZnO, $SiO_2$ and oxides of the other metal components, is preferably less than or equal to 15 mol %, more preferably, less than or equal to 10 mol %, and furthermore preferably, less than or equal to 5 mol %. Here, when calculating in terms of an oxide, they are calculated as $SnO_2$, $TiO_2$, $In_2O_3$, $Ga_2O_3$, $Nb_2O_5$ or $Al_2O_3$.

The composition of the thin film of amorphous metal oxide can be analyzed by performing a substrate correction using EPMA when its thickness is greater than or equal to 200 nm. Further, the composition of the thin film of amorphous metal oxide can be analyzed by using SEM-EDX with acceleration voltage of 10 kV when its thickness is greater than or equal to 700 nm. Further, the composition of the thin film of amorphous metal oxide can be analyzed as well by using XRF with a substrate correction. Further, when using ICP, the thin film of amorphous metal oxide can be analyzed by using volume greater than or equal to 1 $mm^3$.

The thin film of amorphous metal oxide has features such that a clear peak was not observed in X-ray diffraction and that crystallite diameter (Scherrer diameter) obtained by Scherrer's equation expressed by the following equation (1) is less than or equal to 5.2 nm. The lattice constant of ZnO (Wurtzite type) is a=0.33 nm and c=0.52 nm, and this means that the array of atoms in the crystallite is less than or equal to 16 lines. When the Scherrer constant is "K", the X-ray wavelength is "λ", the half band width is "β" and the peak position is "θ", the Scherrer diameter "L2 is expressed as $$L = K\lambda/(\beta \cos \theta) \qquad \text{equation (1)}.$$

The Scherrer constant "K" is 0.9. The X-ray wavelength "λ" is 0.154 nm.

The thin film of amorphous metal oxide has good flatness. The flatness can be measured by an atomic force microscope (AFM), and it is preferable in the invention that the root mean square (RMS) roughness for a measurement range of a 20 μm square is less than or equal to 10 nm. It is more preferable that the root mean square roughness is less than or equal to 5 nm and furthermore preferably, less than or equal to 2 nm. When having such flatness, chemical mechanical polishing (CMP) step can be omitted. If the RMS roughness for the measurement range of 20 μm square is greater than 10 nm, for example, as the bottom electrode and the top electrode of the organic electroluminescent device are locally closer to each other, they tend to be electrically connected. Thus, it is not preferable.

The electron mobility of the thin film of amorphous metal oxide may be $10^{-4}$ $cm^2 \cdot V^{-1}$ $s^{-1}$ to $10^2$ $cm^2 \cdot V^{-1}$ $s^{-1}$, may be $10^{-3}$ $cm^2 \cdot V^{-1}$ $s^{-1}$ to $10^2$ $cm^2 \cdot V^{-1}$ $s^{-1}$, or may be $10^{-2}$ $cm^2 \cdot V^{-1}$ $s^{-1}$ to $10^2$ $cm^2 \cdot V^{-1}$ $s^{-1}$. The electron density of the thin film of amorphous metal oxide may be $1 \times 10^{18}$ $cm^{-3}$ to $1 \times 10^{21}$ $cm^{-3}$, may be $5 \times 10^{18}$ $cm^{-3}$ to $5 \times 10^{20}$ $cm^{-3}$, or may be $1 \times 10^{19}$ $cm^{-3}$ to $1 \times 10^{20}$ $cm^{-3}$.

The thin film of amorphous metal oxide having such electron mobility and electron density has high electrical conductivity and high electron transport capability. Thus, such a thin film of amorphous metal oxide is preferable for an electron transport capability film.

The electron mobility of the thin film of amorphous metal oxide may be obtained by Hall measurement, Time-of-Flight (TOF) or the like. The electron density of the thin film of amorphous metal oxide may be obtained by iodometric titration, Hall measurement or the like.

The electron affinity of the thin film of amorphous metal oxide may be 2.0 eV to 4.0 eV, may be 2.2 eV to 3.5 eV, or may be 2.5 eV to 3.0 eV. When the electron affinity is greater than or equal to 2.0 eV, when the thin film of amorphous metal oxide is used as a layer member of the organic electroluminescent device, for example, electron injection characteristic of the thin film of amorphous metal oxide becomes good and the luminous efficiency of the organic electroluminescent device is improved. Further, when the electron affinity is less than or equal to 4.0 eV, sufficient light emission can be easily obtained from the organic electroluminescent device. As such, the thin film of amorphous metal oxide is preferable for an electron transport capability film having an electron injection function as well.

The ionization potential of the amorphous metal oxide may be 5.5 eV to 8.5 eV, may be 5.7 eV to 7.5 eV, or may be 5.9 eV to 7.0 eV. The thin film of amorphous metal oxide having such large ionization potential has a high hole blocking effect and is capable of selectively transporting only electrons. Thus, the thin film of amorphous metal oxide is preferable for an electron transport capability film having a hole blocking function as well.

The thickness of the thin film of amorphous metal oxide is not limited so, however, may be less than or equal to 10 μm, or may be less than or equal to 2 μm. The thickness of the thin film of amorphous metal oxide may be greater than or equal to 1 nm.

The refraction index of the thin film of amorphous metal oxide may be 1.50 to 2.00, may be 1.60 to 1.95, or may be 1.70 to 1.90. An organic substance layer generally has refraction index of 1.6 to 1.8 and a difference in the refraction index between that of the thin film of amorphous metal oxide is small. Thus, an effect that loss by total reflection at an interface between the thin film of amorphous metal oxide and the organic substance layer is small can be obtained.

The thin film of amorphous metal oxide may be singularly provided, or may be provided under a status that it is formed on a substrate. For the latter case, the material of the substrate is not specifically limited. The substrate may be constituted of a material such as a glass, for example, that does not have good heat-resistance at high temperature exceeding 700° C.

The thin film of amorphous metal oxide may be formed by depositing a film on a substrate by vapor deposition using a target containing zinc (Zn) and silicon (Si).

In the present invention, the "vapor deposition" is a generic name of a deposition method by which a target material is deposited on the substrate after being vaporized including physical vapor deposition (PVD), pulsed laser deposition (PLD), a sputtering method and vacuum vapor deposited.

The sputtering method includes a DC (direct current) sputtering method, a high-frequency sputtering method, a helicon wave sputtering method, an ion beam sputtering method, a magnetron sputtering method and the like. By the sputtering method, the thin film can be deposited on a large area with a relatively uniform thickness.

The target may contain Zn and Si. Zn and Si may be included in a single target, or may be included in a plurality of targets, respectively. In the target, Zn and Si may exist as metals or metal oxides, respectively, or exist as alloys or multiple metal oxides, respectively. The metal oxide or the multiple metal oxides may be crystalline or may be amorphous.

The target may contain, in addition to Zn and Si, one or more metal components selected from a group consisting of Sn, Ti, In, Ga, Nb and Al. Zn, Si and the other metal components may be included in a single target, or may be included in a plurality of targets, respectively. In the target, Zn, Si and the other metal components may exist as metals or metal oxides, respectively, or exist as alloys or multiple metal oxides of two or more metals, respectively. The metal oxide or the multiple metal oxides may be crystalline or may be amorphous.

It is preferable that the relative density of the target is greater than or equal to 90%.

When a single target is used, the atomic ratio of Zn/(Zn+Si) in the target may be 0.30 to 0.95, may be 0.70 to 0.94, may be 0.80 to 0.92, or may be 0.85 to 0.90. When the single target includes one or more metal components selected from the group consisting of Sn, Ti, In, Ga, Nb and Al, in addition to Zn and Si, the content of the other metal components with respect to the total 100 mol % of oxides including ZnO, $SiO_2$ and the other metal components, in terms of an oxide, is preferably less than or equal to 15 mol %, more preferably less than or equal to 10 mol %, and furthermore preferably, less than or equal to 5 mol %. Here, when calculating in terms of an oxide, they are calculated as $SnO_2$, $TiO_2$, $In_2O_3$, $Ga_2O_3$, $Nb_2O_5$, or $Al_2O_3$. The composition analysis of the target can be performed by an XRF method or the like. Here, there is a case that the composition of the formed thin film of amorphous metal oxide is different from the composition ratio of the used target.

When a plurality of targets are used, for example, by sputtering a target of metal Si and a target of ZnO at the same time, the thin film of amorphous metal oxide of the invention can be obtained. Other combinations of the plurality of targets, a combination of a target of ZnO and a target of $SiO_2$, a combination of a plurality of targets each containing ZnO and $SiO_2$ but the ZnO ratio is different, a combination of a target of metal Zn and a target of metal Si, a combination of a target of metal Zn and a target of $SiO_2$, a combination of a target containing metal Zn or metal Si and a target containing ZnO and $SiO_2$ or the like may be used.

When the plurality of targets are used at the same time, by adjusting the electric power to be applied to each of the targets, the thin film of amorphous metal oxide having a desired composition can be obtained.

A deposition target substrate used when depositing the thin film of amorphous metal oxide is not "actively" heated. For example, the vicinity of a mounting part for the deposition target substrate is not heated by a heater or the like. This is because the thin film of amorphous metal oxide is hardly obtained if the temperature of the deposition target substrate increases. However, the deposition target substrate may be "incidentally" heated by sputtering deposition itself such as ion impact or the like. In such a case, how much the temperature of the deposition target substrate increases depends on the condition of sputtering deposition. In order to avoid temperature increasing of the deposition target substrate, the deposition target substrate may be "actively" cooled. It is preferable that the deposition is performed under a condition that the temperature of the deposition target substrate is less than or equal to 70° C. The temperature may be less than or equal to 60° C., or less than or equal to 50° C. The temperature of the substrate can be measured by pressing a front end of a thermo-couple on the substrate in a chamber of a sputtering apparatus.

If the deposition target substrate is not "actively" heated, it is possible to use a material whose heat-resistance is lowered at a high-temperature side that exceeds 700° C. such as a glass, a plastic or the like, for example, as a material of the substrate.

It is preferable that the pressure of the sputtering gas (the pressure in the chamber of the sputtering apparatus) is within a range of 0.05 Pa to 10 Pa, more preferably, 0.1 Pa to 5 Pa, and furthermore preferably, 0.2 Pa to 3 Pa. Within this range, the pressure of the sputtering gas is not too low and the plasma becomes stable. Further, because the pressure of the sputtering gas is not too high, rising of the temperature of the deposition target substrate due to increasing of the ion impact can be suppressed.

It is preferable that the distance (T-S distance) between the target and the deposition target substrate is 2 cm to 20 cm, more preferably, 3 cm to 15 cm, and furthermore preferably, 5 cm to 12 cm. Within this range, as the T-S distance is not too small, rising of the temperature of the deposition target substrate can be suppressed, and the thin film with a further uniform thickness can be obtained. Further, as the T-S distance is not too large, a sufficient deposition rate can be obtained, and the production efficiency can be maintained.

The sputtering gas to be used is not specifically limited. The sputtering gas may be inert gas or noble gas. The sputtering gas may contain oxygen. As the inert gas, for example, $N_2$ gas may be used. Further, as the noble gas, He (helium), Ne (neon), Ar (argon), Kr (krypton) or Xe (xenon) may be used. These may be used singularly or may be used with other gasses. Alternatively, the sputtering gas may be reducing gas such as NO (nitrogen monoxide) or CO (carbon monoxide).

The thin film of amorphous metal oxide of the example of the invention may be adapted to a layer member or the like for an organic device such as an organic electroluminescent device, an organic photovoltaic cell or the like. For example, when the thin film of amorphous metal oxide is adapted to a layer necessary to have electron transport capability in the organic electroluminescent device or in the organic photovoltaic cell, specifically, one or more layers selected from a group consisting of an electron transport layer, an electron injection layer and a hole blocking layer, it is possible to further increase the characteristic of an organic device. For example, an organic device with good stability and high reliability can be provided. Further, for the organic electroluminescent device, the luminous efficiency can be increased. Further, for the organic photovoltaic cell, the conversion efficiency can be increased. For the above described organic photovoltaic cell, the conversion efficiency can be increased even for a photovoltaic cell including an inorganic photovoltaic cell.

(Organic Electroluminescent Device)

The thin film of amorphous metal oxide of the example of the invention may be used as a layer member of an organic electroluminescent device. The organic electroluminescent device of the example of the invention includes an anode and a cathode, which is a pair of electrodes, and a light emitting layer provided between the anode and the cathode. Further, the "thin film of amorphous metal oxide" is provided between the light emitting layer and the cathode. The "thin film of amorphous metal oxide" may be provided as one or more layers selected from an electron transport layer, an electron injection layer and a hole blocking layer.

This means that the organic electroluminescent device of the invention may be either of a structure in which the thin film of amorphous metal oxide is provided as the electron transport layer;

a structure in which the thin film of amorphous metal oxide is provided as the electron injection layer;

a structure in which the thin film of amorphous metal oxide is provided as the hole blocking layer;

a structure in which the thin film of amorphous metal oxide is provided as both the electron transport layer and the electron injection layer;

a structure in which the thin film of amorphous metal oxide is provided as both the electron transport layer and the hole blocking layer; and a structure in which the thin film of amorphous metal oxide is provided as all of the electron transport layer, the electron injection layer and the hole blocking layer.

The organic electroluminescent device of the invention may include the light emitting layer between the anode and the cathode, and may be any of the following structures, provided between the light emitting layer and the cathode, a structure in which the thin film of amorphous metal oxide is provided in contact with the cathode;

a structure in which the thin film of amorphous metal oxide is provided in contact with the light emitting layer;

a structure in which the thin film of amorphous metal oxide is provided in contact with the cathode and the light emitting layer; and a structure in which the thin film of amorphous metal oxide is provided not in contact with the cathode and the light emitting layer. When the thin film of amorphous metal oxide is provided to be in contact with the light emitting layer, as a difference between the refraction index of the thin film of amorphous metal oxide and that of the light emitting layer is small, an effect that loss by total reflection at an interface between the thin film of amorphous metal oxide and the light emitting layer is small can be obtained.

For the structure of the organic electroluminescent device of the invention, for example, the following (a) to (j) may be used.

(a) a cathode/a thin film of amorphous metal oxide/a light emitting layer/an anode;
(b) a cathode/an electron injection layer/a thin film of amorphous metal oxide/a light emitting layer/an anode;
(c) a cathode/an electron injection layer/a thin film of amorphous metal oxide/a hole blocking layer/a light emitting layer/an anode;
(d) a cathode/a thin film of amorphous metal oxide/a hole blocking layer/a light emitting layer/an anode;
(e) a cathode/a thin film of amorphous metal oxide/an electron transport layer/a light emitting layer/an anode;
(f) a cathode/a thin film of amorphous metal oxide/an electron transport layer/a hole blocking layer/a light emitting layer/an anode;
(g) a cathode/an electron transport layer/a thin film of amorphous metal oxide/a light emitting layer/an anode;
(h) a cathode/an electron injection layer/an electron transport layer/a thin film of amorphous metal oxide/a light emitting layer/an anode;
(i) a cathode/a thin film of amorphous metal oxide/an electron injection layer/a light emitting layer/an anode; and
(j) a cathode/a thin film of amorphous metal oxide/an electron injection layer/a hole blocking layer/a light emitting layer/an anode.

Here, the above described device structures are just examples, and the structure of the organic electroluminescent device of the invention is not limited so. Further, one or more layers selected from a group consisting of a hole injection layer, a hole transport layer and an electron blocking layer may be provided between the anode and the light emitting layer in this order from an anode side.

Hereinafter, an example of the organic electroluminescent device of the invention (hereinafter, referred to as an "organic EL device" as well) is described with reference to drawings. FIG. 1 illustrates a schematic cross-sectional view of an organic EL device of the example of the invention. FIG. 1 illustrates an example having the above described device structure of (c) and further including the hole injection layer, the hole transport layer and the electron blocking layer.

As illustrated in FIG. 1, the organic electroluminescent device 100 of the embodiment is configured by stacking a cathode 120, an electron injection layer 130, an electron transport layer 140, a hole blocking layer 145, a light emitting layer 150, an electron blocking layer 155, a hole transport layer 160, a hole injection layer 170 and an anode 180 on a substrate 110 in this order.

However, one or more layers selected from a group consisting of the hole injection layer 170, the hole transport layer 160, the electron blocking layer 155, the hole blocking layer 145 and the electron injection layer 130 may be omitted.

The organic EL device 100 of the example of the present invention has a characteristic that the electron transport layer 140 is constituted of the "thin film of amorphous metal oxide".

Generally, the electron transport layer 140 is constituted of an organic substance such as Tris(8-quinolinolato)aluminum (Alq3). However, the organic substance such as Alq3 has relatively low electron mobility and whose electrical conductivity is not good. Thus, in order to use this material as the electron transport layer, it is necessary to make it thin in order to ensure sufficient electron transport capability. However, if the layer is made thin, the above described optical loss is generated by the Evanescent light (near-field light) and the surface plasmon at a surface of a metal electrode. This loss by plasmon becomes larger as the distance between the light emitting portion and the electrode is shorter, and the loss is about 70% when the distance is 30 nm and about 30% when the distance is 50 nm. This means that if the distance between the light emitting portion and the metal electrode is 30 nm, 70% of the light generated at the light emitting portion is absorbed by the plasmon. Further, if the layer is made thin, there is a risk that a layered thin film cannot be obtained. On the other hand, if the layer is made thick, sufficient electrical conductivity cannot be obtained, and there is a risk such as that the electron transport capability is insufficient, the voltage necessary for the light emission of the organic EL device increases.

Further, the organic substance such as Alq3 has relatively bad stability, and there is a problem that it is easily deteriorated when contacting the air. Thus, it is necessary for the electron transport layer made of Alq3 to be handled under a controlled environment, and as a result, there is a risk that the manufacturing process becomes complicated.

Further, the organic substance such as Alq3 has a characteristic that its mobility of holes is relatively high. Thus, when the electron transport layer made of Alq3 is used, holes that do not recombine with electrons in the light emitting layer 150 pass through the electron transport layer 140 to reach the cathode 120, and there is a risk that the luminous efficiency is lowered.

As such, if the electron transport layer does not have sufficient electrical conductivity, if the electron transport layer is degraded, or if holes pass the electron transport layer, there is a possibility that the organic electroluminescent device does not have desired light-emission characteristic, or reliability of the organic electroluminescent device is lowered.

On the other hand, according to the organic EL device 100 of the example of the invention, the thin film of amorphous metal oxide is provided as the electron transport layer 140. The thin film of amorphous metal oxide has good electrical conductivity. Thus, when the thin film of amorphous metal oxide is used as the electron transport layer 140, it is unnecessary for the layer to be about 50 nm, such as for conventional Alq3.

Further, as the thin film of amorphous metal oxide is constituted of a stable inorganic material, the thin film of amorphous metal oxide is not deteriorated or degraded even by contacting the air. Thus, a problem such as it is necessary to be handled under a controlled environment and the manufacturing process is complicated, generated for a conventional electron transport layer made of Alq3, can be solved.

Further, the thin film of amorphous metal oxide has good electron affinity for moderating the electron injection barrier from the cathode 120 to the light emitting layer 150. Thus, according to the present invention, the organic EL device with high luminous efficiency can be obtained.

In addition, the thin film of amorphous metal oxide has characteristic that its ionization potential is large. Thus, the thin film of amorphous metal oxide has a so-called hole blocking effect. This means that the thin film of amorphous metal oxide can prevent holes that are not recombined with electrons in the light emitting layer 150 from passing through the electron transport layer 140 and reaching the cathode 120 to thereby increase the probability of the electrons and the holes being recombined. Thus, according to the present invention, the organic EL device with high luminous efficiency can be obtained.

By providing the thin film of amorphous metal oxide as the electron transport layer 140, the organic EL device easy to be handled with high reliability can be provided.

Next, a structure of each of the layers that constitute the organic EL device 100 illustrated in FIG. 1 is described more detail.

(Substrate 110)

The substrate 110 has a function to support layers that constitute the organic EL device 100 at its upper portion. The material of the substrate 110 is not specifically limited. In FIG. 1, when a light extraction surface of the organic EL device 100 is positioned at a lower side (in other words, at a substrate 110 side), the substrate 110 is constituted of a transparent material. As the substrate 110, a glass substrate, a plastic substrate or the like is used, for example.

(Cathode 120)

The cathode 120 is generally constituted of metal. Here, when the light extraction surface of the organic EL device 100 is positioned at the lower side (in other words, at the substrate 110 side), the cathode 120 is constituted of a transparent material. As the cathode 120, a transparent thin film of metal oxide such as ITO (indium tin oxide) is used, for example.

The cathode 120 may be a metal material such as aluminum, silver, gold, magnesium, calcium, titanium, yttrium, lithium, gadolinium, ytterbium, ruthenium, manganese, molybdenum, vanadium, chromium, tantalum, or an alloy of the above described metals, for example. Alternatively, the cathode 120 may be metal oxide such as ITO, antimony oxide ($Sb_2O_3$), zirconium oxide ($ZrO_2$), tin oxide ($SnO_2$), zinc oxide (ZnO), IZO (Indium Zinc Oxide), AZO (ZnO—$Al_2O_3$: aluminum doped zinc oxide), GZO (ZnO—$Ga_2O_3$: gallium doped zinc oxide), Nb doped $TiO_2$, Ta doped $TiO_2$, IWZO ($In_2O_3$—$WO_3$—ZnO: tungstic trioxide and zinc oxide doped indium oxide) or the like, for example.

The deposition method of the cathode 120 is not specifically limited. The cathode 120 may be deposited by vapor deposition (vacuum vapor deposition, electron beam vapor deposition), ion plating, laser ablation, a sputtering method or the like.

Typically, the thickness of the cathode 120 is within a range of 50 nm to 150 nm. It is preferable that the thickness of the cathode 120 is within a range of 2 nm to 50 nm when the metal material is used as the transparent electrode.

(Electron Injection Layer 130)

The electron injection layer 130 is selected from a material having an electron injection function. The electron injection layer 130 may be one or more selected from a group consisting of lithium fluoride, cesium carbonate, sodium chloride, cesium fluoride, lithium oxide, barium oxide, barium carbonate and (8-quinolinolato)lithium.

The electron injection layer 130 may be formed by a thin film of amorphous oxide electride containing calcium atoms and aluminum atoms.

Here, the "amorphous oxide electride" means an amorphous solid material constituted of solvation in which amorphous material composed of calcium atoms, aluminum atoms and oxygen atoms is solvent and electrons are solutes. The electrons in the amorphous oxide function as anions. The electrons may exist as bipolarons. It is preferable that the molar ratio (Ca/Al) of aluminum atoms and calcium atoms in the thin film of amorphous oxide electride is within a range of 0.3 to 5.0, and more preferably, within a range of 0.55 to 1.00.

Although the deposition method of the electron injection layer 130 is not specifically limited, the electron injection layer 130 may be deposited by vapor deposition. For example, an electron injection material may be heated under vacuum of $10^{-3}$ Pa to $10^{-7}$ Pa to be vapor deposited. Further, the electron injection layer 130 may be deposited by a sputtering method or the like.

It is preferable that the thickness of the electron injection layer 130 is generally 0.5 nm to 2.0 nm. This is because if the electron injection layer 130 is too thin, the electron injection effect becomes small and if the electron injection layer 130 is too thick, the volume resistivity becomes high. Here, the electron injection layer 130 may be omitted.

(Electron Transport Layer 140)

As described above, the thin film of amorphous metal oxide is provided in the electron transport layer 140 in the organic EL device 100.

As described above, the electron transport layer 140 composed of the thin film of amorphous metal oxide has good electron mobility. This electron mobility is higher by a few orders compared with an organic electron transport layer made of Alq3 that is used for a conventional electron transport layer 140. By using the thin film of amorphous metal oxide, even when the electron transport layer 140 is made thick, the voltage necessary for the light emission of the organic EL device does not easily increase. Thus, the electron transport layer 140 can be made thick, which is difficult for the organic electron transport layer.

The thickness of the electron transport layer 140 composed of the thin film of amorphous metal oxide may be, for example, 70 nm to 2000 nm, preferably, 100 nm to 1500 nm, more preferably, 200 nm to 1000 nm and furthermore preferably, 300 nm to 500 nm. By making the electron transport layer 140 to have such a thickness, the above described optical loss due to plasmon can be reduced, and the external quantum efficiency can be improved by improving the light extracting efficiency by an optical design. Further, compared with a case when the electron transport layer made of an organic substance is used, it is possible to suppress a short circuit of the organic EL device. With this, reliability or yield of the organic EL device can be improved. Although this effect of suppressing the short circuit of the organic EL device is effective for a display such as an active matrix composed of fine pixels, in particular, it is significantly effective for illumination with larger pixels. Further, by making the electron transport layer 140 to be the above described thickness, the manufacturing cost can be suppressed because the thin film can be manufactured within a short period. The electron transport layer 140 may be deposited by the above described deposition method.

(Hole Blocking Layer 145)

The hole blocking layer 145 is selected from a material having a hole blocking function. The hole blocking layer may be a material with high HOMO level, or the like, for example. Alternatively, the hole blocking layer may be inorganic oxide, metal oxide or the like. For example, IGZO (In—Ga—Zn—O), ITO (In—Sn—O), ISZO (In—Si—Zn—O), IGO (In—Ga—O), ITZO (In—Sn—Zn—O), IZO (In—Zn—O), IHZO (In—Hf—Zn—O) or the like may be used.

Further, the hole blocking layer 145 may be formed by the above described thin film of "amorphous oxide electride". It is preferable that the molar ratio (Ca/Al) of aluminum atoms and calcium atoms in the thin film of "amorphous oxide electride" is within a range of 0.3 to 5.0, and more preferably, within a range of 0.55 to 1.00.

Here, the hole blocking layer 145 may be omitted.

(Light Emitting Layer 150)

The light emitting layer 150 may be made of any known luminescent materials for an organic electroluminescent device.

The light emitting layer 150 may be epidorisin, 2,5-bis [5,7-di-t-pentyl-2-benzoxazolyl]thiophene, 2,2'-(1,4-phenylenedipynylene)bisbenzothiazole, 2,2'-(4,4'-biphenylene) bisbenzothiazole, 5-methyl-2-{2-[4-(5-methyl-2-benzoxazolyl)phenyl]vinyl}benzoxazole, 2,5-bis(5-methyl-2-benzoxazolyl)thiophene, anthracene, naphthalene, phenanthrene, pyrene, chrysene, perylene, perinone, 1,4-diphenyl butadiene, tetraphenyl butadiene, coumarin, acridine, stilbene, 2-(4-biphenyl)-6-phenylbenzoxazole, aluminum trisoxine, magnesium bisoxine, bis(benzo-8-quinolinol)zinc, bis(2-methyl-8-quninolinato)aluminum oxide, indium trisoxine, aluminum tris(5-methyloxine), oxine lithium, gallium trisoxine, calcium bis(5-chloro-oxine), polyzinc-bis(8-hydroxy-5-quinolinolyl)methane, dilithium epindolidione, zinc bisoxine, 1,2-phthaloperinone, 1,2-naphthaloperinone or the like, for example.

The light emitting layer 150 may be deposited by a dry process such as vapor deposition, transfer printing or the like. Alternatively, the light emitting layer 150 may be deposited by a wet process such as spin coating, spray coating, gravure printing or the like.

Typically, the thickness of the light emitting layer 150 is within a range of 1 nm to 100 nm. Further, the hole transport layer may also function as the light emitting layer.

(Electron Blocking Layer 155)

The electron blocking layer 155 is selected from a material having an electron blocking function.

The electron blocking layer 155 may be an organic material, for example, a material with low LUMO level. For example, Tris(phenylpyrazole)iridium (Ir(ppz)3) or the like may be used.

(Hole Transport Layer 160)

The hole transport layer 160 is selected from a material having a hole transport function.

The hole transport layer 160 may be an arylamine based compound, an amine compound containing a carbazole group, an amine compound containing a fluorine derivative or the like, for example. Specifically, the hole transport layer 160 may be 4,4'-Bis[N-(naphtyl)-N-phenyl-amino]biphenyl (α-NPD), N,N'-Bis(3-methylphenyl)-(1,1'-biphenyl)-4,4'-diamine (TPD), 2-TNATA, 4,4',4"-Tris(N-(3-methylphenyl) N-phenylamino)triphenyl amine (MTDATA), 4,4'-N,N'-Bis carbazole biphenyl (CBP), spiro-NPD, spiro-TPD, spiro-TAD, TNB or the like.

The hole transport layer 160 may be deposited by a conventionally known general deposition process.

Typically, the thickness of the hole transport layer 160 is within a range of 1 nm to 100 nm.

Here, the hole transport layer 160 may be omitted.

(Hole Injection Layer 170)

The hole injection layer 170 is selected from a material having a hole injection function.

The hole injection layer 170 may be an organic substance, such as CuPc, starburst amine and the like, for example. Alternatively, the hole injection layer 170 may be metal oxide such as an oxide material containing one or more metals selected from a group consisting of molybdenum, tungsten, rhenium, vanadium, indium, tin, zinc, gallium, titanium and aluminum, for example.

Generally, when a top electrode formed on an organic substance layer is deposited by a sputtering method, it is known that a characteristic of the organic EL device is degraded due to sputtering damage to the organic substance layer. As metal oxide has higher resistance to sputtering compared to the organic substance, by depositing the metal oxide layer on the organic substance layer, sputtering damage to the organic substance layer can be reduced.

The deposition method of the hole injection layer 170 is not specifically limited. The hole injection layer 170 may be deposited by a dry process such as vapor deposition, transfer printing or the like. Alternatively, the hole injection layer 170 may be deposited by a wet process such as spin coating, spray coating, gravure printing or the like.

Typically, the thickness of the hole injection layer 170 is within a range of 1 nm to 50 nm. Here, the hole injection layer 170 may be omitted.

(Anode 180)

As the anode 180, generally, a metal or metal oxide is used. The material used for the anode 180 preferably has a work function greater than or equal to 4 eV. When the light extraction surface of the organic EL device 100 is arranged to be at the anode 180 side, the anode 180 needs to be transparent.

The anode 180 may be a metal material such as aluminum, silver, tin, gold, carbon, iron, cobalt, nickel, copper, zinc, tungsten, vanadium, or an alloy of the above described metals, for example. Alternatively, the anode 180 may be metal oxide such as ITO, antimony oxide ($Sb_2O_3$), zirconium oxide ($ZrO_2$), tin oxide ($SnO_2$), zinc oxide (ZnO), IZO (Indium Zinc Oxide), AZO (ZnO—$Al_2O_3$: aluminum doped zinc oxide), GZO (ZnO—$Ga_2O_3$: gallium doped zinc oxide), Nb doped $TiO_2$, Ta doped $TiO_2$, IWZO ($In_2O_3$—$WO_3$—ZnO: $In_2O_3$—$WO_3$—ZnO: tungstic trioxide and zinc oxide doped indium oxide) or the like, for example.

The deposition method of the anode 180 is not specifically limited. The anode 180 may be formed by a known deposition technique such as vapor deposition, a sputtering method, coating or the like.

Typically, the thickness of the anode 180 is within a range of 50 nm to 150 nm. When a metal material is used as the transparent electrode, it is preferable that the thickness of the anode 180 is within a range of 2 nm to 50 nm.

Here, for the example of FIG. 1, a structure of the organic EL device is described by exemplifying a case in which the cathode 120 is provided closer to the substrate 110 and the anode 180 is provided further from the substrate 110.

However, according to the present invention, the structure of the organic EL device is not limited so. For example, opposite from the structure of FIG. 1, the anode 180 may be provided closer to the substrate 110 and the cathode 120 may be provided further from the substrate 110. In such a case, the organic EL device has a structure in which the layers 120 to 180 except the substrate 110 of FIG. 1 are flipped vertical.

Generally, in the organic EL device, each layer (hereinafter referred to as an "organic layer") provided between the cathode and the anode has a tendency that its characteristic is deteriorated due to environmental components such as moisture or the like. Thus, it is preferable that the organic layer is insulated from environmental factors such as moisture or the like. Further, as the organic layer is relatively weak to physical contacts, it is preferable to increase mechanical strength.

In this regard, according to the organic EL device of the embodiment of the invention, the surface of the organic layer can be stabilized (passivation) by the thin film of amorphous metal oxide (140) which has good chemical durability. Further, the organic layer can be physically protected as well by the thin film of amorphous metal oxide (140) which has good mechanical strength.

For example, according to the structure of the organic EL device 100 as illustrated in FIG. 1, the cathode 120 and the electron injection layer 130 can be chemically and physically protected by the thin film of amorphous metal oxide (140). Further, for example, for a structure in which the layers 120 to 180 except the substrate 110 of FIG. 1 are flipped vertical, each of the hole blocking layer 145 to the anode 180 can be chemically and physically protected by the thin film of amorphous metal oxide (140).

According to the embodiment of the present invention, with these effects, it is possible to easily transfer a semifabricated product in the air while manufacturing the organic EL device, and the manufacturing of the organic EL device is simplified.

The organic EL device of the invention may be either of the following structures.

(1) a structure including a substrate, a cathode and an anode in this order, in which a substrate side is a light extracting surface;
(2) a structure including a substrate, a cathode and an anode in this order, in which an anode side is a light extracting surface;
(3) a structure including a substrate, an anode and a cathode in this order, in which a substrate side is a light extracting surface; and
(4) a structure including a substrate, an anode and a cathode in this order, in which a cathode side is a light extracting surface.

In the light of an aperture ratio, it is preferable that the organic EL device of the invention has either of the above described structures (2) and (4). Further, in the light of luminance stability of the organic EL device, it is preferable that the organic EL device of the invention has the above described structure (1) or (2).

For another example of the organic EL device of the invention, the organic EL device 100 may have a structure in which the thin film of amorphous metal oxide is provided as the electron injection layer 130. As the thin film of amorphous metal oxide has good electron affinity for moderating the electron injection barrier from the cathode 120 to the light emitting layer 150, the thin film of amorphous metal oxide can preferably function as the electron injection layer.

Further, for another example of the organic EL device of the invention, the organic EL device 100 may include the thin film of amorphous metal oxide as the hole blocking layer 145. The thin film of amorphous metal oxide can preferably function as the hole blocking layer as its hole blocking effect is high and having large ionization potential.

Here, when the thin film of amorphous metal oxide is not provided as the electron transport layer 140 in the organic EL device 100, the electron transport layer 140 may be constituted of a material having electron transport capability. As the material having electron transport capability, Tris(8-quinolinolato)aluminum (Alq3), Bathocuproine (BCP), Bis (2-methyl-8-quinolinolate)-4-(phenylphenolato)aluminium (BAlq) may be used, for example. Alternatively, the electron transport layer that is also used as the light emitting layer may be provided.

Generally, the chemical stabilities of the cathode and the electron injection layer, whose work functions are low, are poor, among each of the materials composing the organic EL device. Thus, when the organic EL device is used for a long period, deterioration of the cathode and the electron injection layer due to a chemical reaction such as oxidation or the like determines the long term stability of the organic EL device itself. Thus, by covering the cathode and the electron injection layer by the electron transport layer constituted of the thin film of amorphous metal oxide that is chemically stable and has low gas permeability, as the organic EL device of the invention, an effect that the lifetime of the organic EL device is extended can be obtained compared with a case when the organic substance such as Alq3 is used.

Here, the organic EL device of the invention may have a structure in which the electron transport layer that is the thin film of amorphous oxide electride containing calcium atoms and aluminum atoms or the cathode is not provided.

(Organic Photovoltaic Cell)

The above described "thin film of amorphous metal oxide" of the invention may be used as a layer member of an organic photovoltaic cell. The organic photovoltaic cell includes a pair of electrodes and a photoelectric conversion layer constituted of an organic substance between the pair of electrodes. The pair of electrodes includes an electrode for extracting electrons and an electrode for extracting holes. In the organic photovoltaic cell of the invention, the "thin film of amorphous metal oxide" is provided between the photoelectric conversion layer and the electrode for extracting electrons.

The thin film of amorphous metal oxide may be provided as one or more layers selected from the electron transport layer, the electron injection layer and the hole blocking layer.

The structure of the organic photovoltaic cell of the invention may be (a) to (h) as explained above for the organic EL device, and may be the structure of the organic EL device 100 of FIG. 1. The electrode for extracting holes of the organic photovoltaic cell may be read as the anode of the organic EL device. The electrode for extracting electrons of the organic photovoltaic cell may be read as the cathode of the organic EL device. The photoelectric conversion layer of the organic photovoltaic cell may be read as the light emitting layer of the organic EL device.

By providing the thin film of amorphous metal oxide as one or more layers selected from the electron transport layer, the electron injection layer and the hole blocking layer, the organic photovoltaic cell with good stability and high reliability can be provided. Further, it is possible to improve the conversion efficiency.

The above described case of the organic photovoltaic cell is just an example, and even for a photovoltaic cell including an inorganic photovoltaic cell, the photovoltaic cell with good stability and high reliability can be provided, and the conversion efficiency can be improved.

An example of the embodiment of the invention is described above by exemplifying the thin film of metal oxide containing zinc (Zn), silicon (Si) and oxygen (O) in which the atomic ratio of Zn/(Zn+Si) is 0.30 to 0.95 is constituted of amorphous. However, the entirety of the thin film of metal oxide having this composition is not necessarily amorphous. In other words, in this embodiment, the thin film of metal oxide may be microcrystal, or alternatively, may be an embodiment in which amorphous and microcrystal are mixed. It should be apparent for those skilled in the art that the descriptions in the above described paragraphs of (thin film of amorphous metal oxide), (organic electroluminescent device), (organic photovoltaic cell) and/or the like are applicable for such a thin film of metal oxide.

Here, the flatness of the thin film of metal oxide of the embodiment tends to be improved when it is amorphous or an amorphous status is dominant. Further, the thin film of metal oxide tends to have linearity between the electron affinity and the composition when it is amorphous or an amorphous status is dominant, and it is easy to select a plurality of bands as the photoelectric conversion device. Further, a uniform film thin film of metal oxide can be obtained when it is amorphous or an amorphous status is dominant. On the other hand, as the thin film of metal oxide of the embodiment tends to be oriented in a width direction when it is microcrystal compared with when it is amorphous, electronic characteristic in the width direction can be more improved when microcrystal is dominant.

EXAMPLES

Hereinafter, examples of the embodiment and comparative examples are described. Examples 1 to 7, 11, 12 and 14 are working examples and Examples 8, 9, 13 and are comparative examples.

Example 1 to Example 9

In each example, a thin film of metal oxide was fabricated on a substrate by a following method and its characteristics were evaluated.

(Deposition Condition)

As a deposition apparatus, an RF magnetron sputtering apparatus (manufactured by ULVAC, Inc.) was used. As a sputtering target, a target with a diameter of 2 inches including a sintered body of a specific ratio of ZnO and $SiO_2$, mol % in terms of an oxide, was used for each sample.

First, a deposition target substrate was introduced in a chamber of the sputtering apparatus.

After evacuating the chamber of the sputtering apparatus to vacuum of less than or equal to $10^{-5}$ Pa, 20 sccm of predetermined sputtering gas was introduced in the chamber. As the sputtering gas, argon (Ar) gas (G1 grade: purity 99.99995 vol. %) or mixed gas of oxygen ($O_2$) gas (G1 grade: purity 99.99995 vol. %) and Ar gas (G1 grade) was used. This means that as the sputtering gas, Ar gas or $O_2$/Ar mixed gas whose oxygen concentration was 20% was used.

The pressure of the sputtering gas was set to be a predetermined pressure, the distance (T-S distance) between the target and the deposition target substrate was set to be a predetermined space and electric power of 50 W was applied to a sputtering cathode. The substrate temperature when depositing was less than or equal to 70° C. Deposition conditions in sputtering of Examples 1 to 9 are illustrated in Table 1.

(Evaluation 1: Atomic Ratio)

A nickel substrate was used as the deposition target substrate. The atomic ratio (Zn/(Zn+Si)) for the thin film of metal oxide that was deposited on the nickel substrate was obtained. The atomic ratio was obtained by performing an SEM-EDX analysis on the thin film. Here, in order to reduce influence of the substrate, the acceleration voltage was set to be 10 kV. The result is illustrated in Table 2.

(Evaluation 2: XRD)

Figure 2:
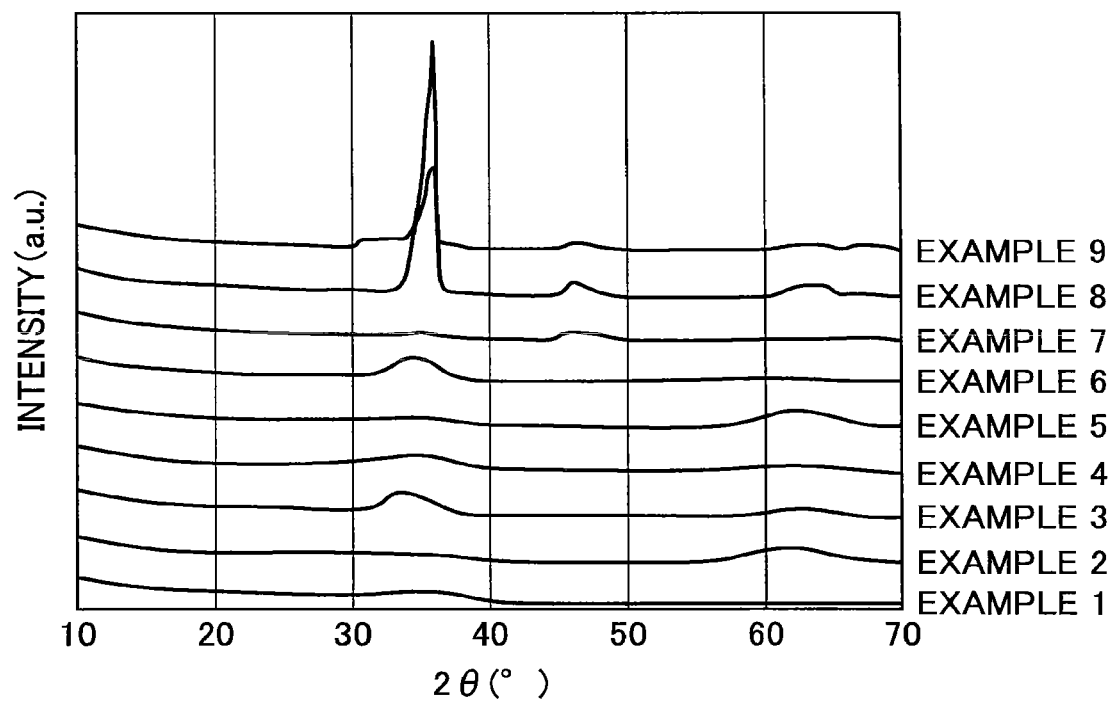
FIG. 2 illustrates XRD spectra of thin films obtained in Example 1 to Example 9, respectively.

A silica glass substrate was used as the deposition target substrate. An X-ray diffraction spectrum for the thin film of metal oxide deposited on the silica glass substrate was measured by a Seemann Bohlin technique using an X-ray diffraction apparatus RINT-2000 manufactured by RIGAKU. The Seemann Bohlin technique is described in Bulletin of the Japan Institute of Metals Vol. 27 (1988) No. 6, pages 461 to 465. The diffraction pattern was obtained by irradiating the electron beam on Cu under a condition of acceleration voltage 50 kV and discharging current 300 mA, and irradiating the generated CuKα rays on the sample while fixing the incident angle to be 0.50. FIG. 2 illustrates obtained diffraction patterns. A halo pattern derived from Wurtzite type ZnO was observed for all of the diffraction patterns. The Scherrer diameter at (002) plane of Wurtzite type ZnO when 2θ is near 33° is illustrated in Table 2. For all of the thin films obtained in Examples 1 to 7, the Scherrer diameter was less than or equal to 5 nm, and it was confirmed to be amorphous by X-ray diffraction analysis. On the other hand, for Examples 8 and 9, the Scherrer diameter was greater than 5 nm, and it was confirmed to be crystalline by X-ray diffraction analysis.

(Evaluation 3: UPS)

Figure 3:
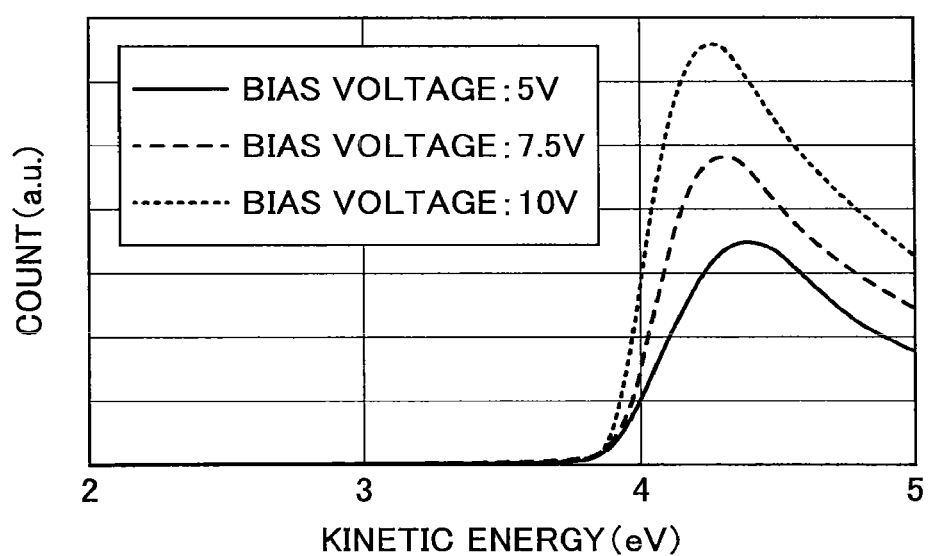
FIG. 3 illustrates a UPS spectrum (work function) of the thin film obtained in Example 1.
Figure 4:
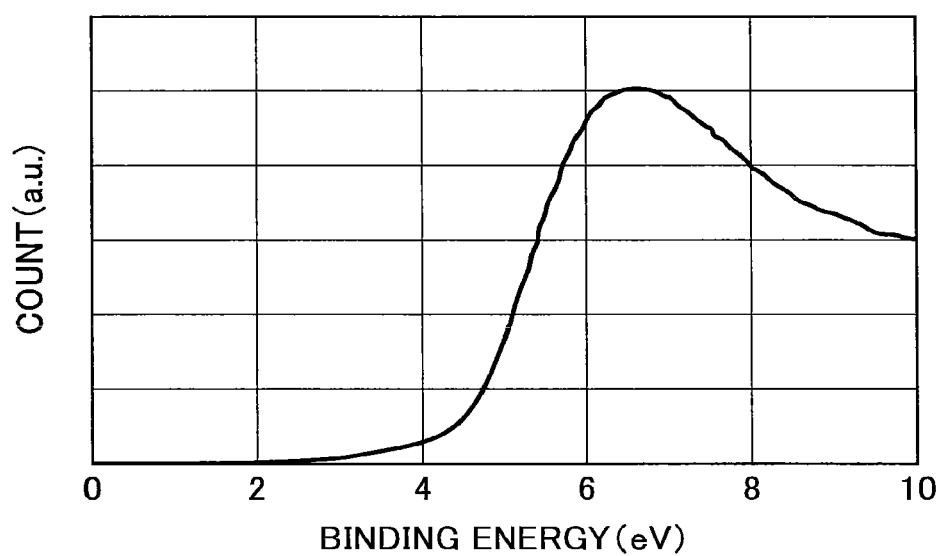
FIG. 4 illustrates a UPS spectrum (ionization potential) of the thin film obtained in Example 1.

An ITO substrate in which ITO with a thickness of 150 nm was deposited on an alkali-free substrate was used as the deposition target substrate. The thin film of metal oxide with a thickness of 10 nm was deposited on the ITO substrate (at a surface where ITO was deposited). Ionization potential was measured by ultraviolet photoelectron spectroscopy (UPS) for this thin film. Ultraviolet light (He(I), 21.22 eV) of a He lamp was irradiated on the thin film under high vacuum greater than or equal to $10^{-7}$ Pa. The spectra of the thin film obtained in Example 1 are illustrated in FIG. 3 and FIG. 4. FIG. 3 illustrates a relationship between the count number of photo-electrons and kinetic energy of photo-electrons, and the work function was estimated to be 3.9 eV. FIG. 4 illustrates a relationship between the count number of photo-electrons and binding energy, wherein the ionization potential was obtained by the sum of the binding energy and the work function, and the ionization potential was estimated to be 6.6 eV.

(Evaluation 4: Optical Absorption Coefficient)

Figure 5:
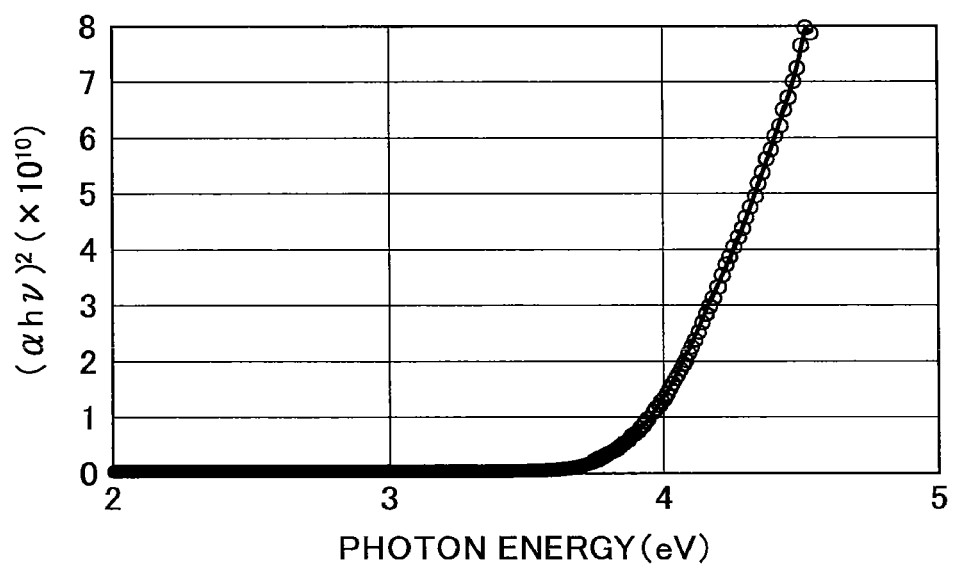
FIG. 5 is a Tauc plot of the thin film obtained in Example 1.
Figure 6:
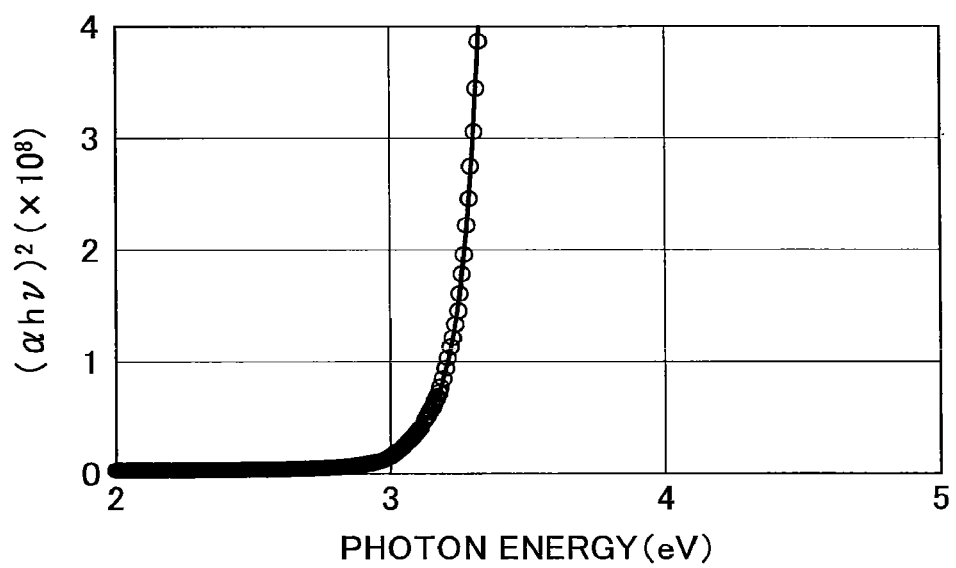
FIG. 6 is a Tauc plot of the thin film obtained in Example 2.

Similarly as Evaluation 2, the silica glass substrate was used as the deposition target substrate. The optical absorption coefficient of the thin film of metal oxide deposited on the silica glass substrate was obtained by measuring the reflectance and the transmittance. Further, an optical band gap was obtained from the obtained Tauc plot of optical absorption coefficients. As an example, FIG. 5 and FIG. 6 illustrate Tauc plots of the thin film of amorphous metal oxides deposited in Examples 1 and 2, respectively. The optical band gaps obtained for Examples 1 to 7 were 3.2 to 4.0. Table 2 illustrates obtained optical band gaps. When considering also with the result of the ionization potential obtained by UPS, the electron affinity of the thin film of amorphous metal oxide deposited in Example 1 is estimated to be 2.6 eV. When assuming that the thin film of amorphous metal oxide deposited in each of Examples 2 to 7 has the similar ionization potential, the electron affinities are estimated to be about 3.3 to 3.4 eV.

(Evaluation 5: Resistivity)

Similarly as Evaluation 2, the silica glass substrate was used as the deposition target substrate. The resistivity of the thin film of amorphous metal oxide deposited on the silica glass substrate was measured by a four-terminal method. Here, Nd containing aluminum with a width of 1 mm with a space of 2 mm was deposited on the thin film of metal oxide by sputtering to form electrodes. 2 mol % Nd containing aluminum (product name: AD20) target with a diameter of 2 inches manufactured by Kobelco Research Institute, Inc. was used as the target. The resistivity was measured for each of the thin films of amorphous metal oxide deposited in Examples 2 to 7 by a four-terminal method. Table 2 illustrates the measured result of the resistivity.

(Evaluation 6: Evaluation of Electron Transport Capability)

Figure 7:
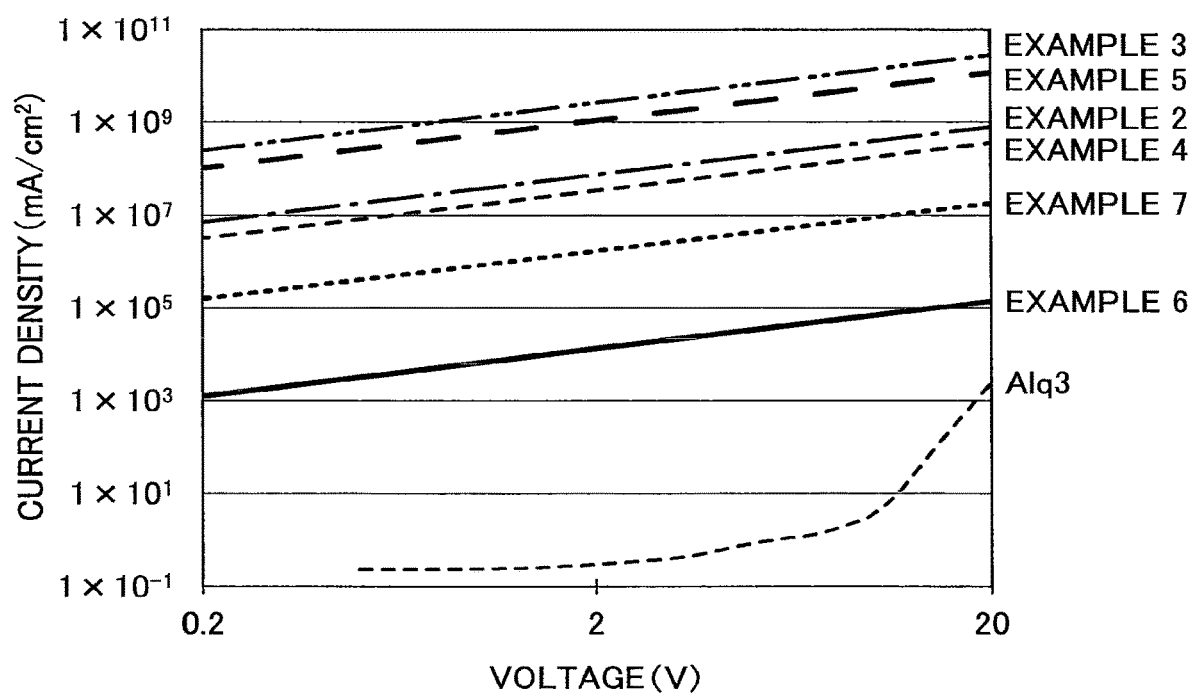
FIG. 7 is a graph illustrating current-voltage characteristic of an actual measured value of an electron only and current-voltage characteristics of calculated values obtained from resistivity's of Examples 2 to 7.

Meanwhile, an electron only device 10 was manufactured by the following method, and its characteristic was evaluated. The electron only device 10 was manufactured by providing a cathode as a bottom electrode on a glass substrate, providing an electron transport layer with a thickness of 150 nm on the bottom electrode, and providing an anode as a top electrode on the electron transport layer to be orthogonal to the bottom electrode. The cathode was deposited by sputtering using a 2 mol % Nd containing aluminum target (product name: AD20) manufactured by Kobelco Research Institute, Inc. with a diameter of 2 inches to form Nd containing aluminum with a thickness of 80 nm and a width of 1 mm. As the electron transport layer, an Alq3 layer with a thickness of 150 nm was formed. The anode was formed by vacuum evaporation to form aluminum with a thickness of 80 nm. A voltage is applied to the cathode and the anode of the electron only device 10 and the current value was measured. FIG. 7 illustrates obtained current-voltage characteristic by "Alq3" curve.

FIG. 7 further illustrates current-voltage characteristics of calculated values obtained from resistivity's of Examples 2 to 7. The following formula (2) was used for calculation. Here, "I" is current density, "A" is dimensions, "E" is voltage, "ρ" is resistivity, and "L" is the thickness of the electron transport layer. The thickness of the electron transport layer was 150 nm.

$$I/A = E/(\rho \cdot L) \quad \text{formula (2)}$$

From FIG. 7, it can be understood that the current flows more, greater than or equal to a few orders, in each of Examples 2 to 7 compared with the electron only device 10 in which Alq3 was used as the electron transport layer within a range up to the applied voltage of 20 V. Further, it can be understood that, when the thin film of amorphous metal oxide of each of Examples 2 to 7 was used as the electron transport layer, the organic EL device has sufficient electron transport capability as the organic EL device even when its thickness was 150 nm. Here, when applying the voltage greater than 20 V, the device was deteriorated and it was not practical.

TABLE 1

| EXAMPLE | COMPOSITION OF TARGET (mol %) ZnO/SiO$_2$ | GAS PRESSURE (Pa) | OXYGEN CONCENTRATION (%) | T-S DISTANCE (cm) |
| --- | --- | --- | --- | --- |
| 1 | 85/15 | 0.3 | 20 | 5 |
| 2 | 90/10 | 0.3 | 0 | 11 |
| 3 | 90/10 | 1.0 | 0 | 11 |
| 4 | 90/10 | 0.3 | 0 | 6.5 |
| 5 | 90/10 | 1.0 | 0 | 6.5 |
| 6 | 90/10 | 0.3 | 20 | 6.5 |
| 7 | 95/5 | 0.3 | 0 | 5 |
| 8 | 97/3 | 0.3 | 0 | 6.5 |
| 9 | 97/3 | 0.3 | 20 | 6.5 |

TABLE 2

| EXAMPLE | Zn/(Zn + Si) | SCHERRER DIAMETER (nm) | STATUS | BAND GAP (eV) | ELECTRON AFFINITY (eV) | RESISTIVITY (Ωcm) |
| --- | --- | --- | --- | --- | --- | --- |
| 1 | 0.76 | 1.2 | AMORPHOUS | 4.0 | 2.6 | — |
| 2 | 0.88 | 1.1 | AMORPHOUS | 3.3 | 3.3 | 1.8 |
| 3 | 0.91 | 2.3 | AMORPHOUS | 3.3 | 3.3 | $5.2 \times 10^{-2}$ |
| 4 | 0.86 | 1.4 | AMORPHOUS | 3.3 | 3.3 | 4.1 |
| 5 | 0.89 | 1.3 | AMORPHOUS | 3.3 | 3.3 | $1.3 \times 10^{-1}$ |
| 6 | 0.88 | 2.2 | AMORPHOUS | 3.3 | 3.3 | $9.8 \times 10^{3}$ |
| 7 | 0.94 | 4.2 | AMORPHOUS | 3.2 | 3.4 | 75 |
| 8 | 0.96 | 7.0 | CRYSTALLINE | — | — | — |
| 9 | 0.96 | 8.4 | CRYSTALLINE | — | — | — |

Example 11

The organic EL device 200 was manufactured by the following method, and its characteristic was evaluated. The organic EL device was configured by providing the cathode 120 as a bottom electrode on the glass substrate 110, and providing the electron transport layer 140, the light emitting layer 150, the hole transport layer 160, the hole injection layer 170 and the anode 180 as a top electrode thereon in this order to extract light from the anode side. Here, the above numerals refer to FIG. 1. However, the organic electroluminescent device 100 is substituted for by the organic EL device 200. Further, in Example 11, formation of the electron injection layer 130, the hole blocking layer 145 and the electron blocking layer 155 was omitted.

First, the cathode 120 was formed on the glass substrate 110. As the glass substrate 110, an alkali-free glass substrate was used. Washed glass substrate 110 and a metal mask were placed in a chamber of a sputtering apparatus. Further, a target for depositing the cathode 120 was provided in the chamber of the sputtering apparatus. As the target for the cathode, a 2 mol % Nd containing aluminum target (product name: AD20) manufactured by Kobelco Research Institute, Inc. with a diameter of 2 inches was used. The cathode 120 with a thickness of 80 nm and a width of 1 mm was deposited on the glass substrate 110 by sputtering using a metal mask. The sputtering gas was Ar, the pressure of the sputtering gas was 0.3 Pa and the electric power of 50 W was applied to the sputtering cathode.

Next, the electron transport layer 140 was formed on the cathode 120. The thin film of amorphous metal oxide, as the electron transport layer 140, with a thickness of 100 nm was formed on the glass substrate 110 on which the cathode 120 was formed without moving the metal mask under the sputtering condition of Example 7.

Next, the light emitting layer 150, the hole transport layer 160 and the hole injection layer 170 were formed on the electron transport layer 140. The glass substrate 110 on which the electron transport layer 140 (and the cathode 120) were formed was transferred from the chamber of the sputtering apparatus to a vacuum vapor deposition chamber under a high vacuum environment of less than or equal to $10^{-4}$ Pa. Subsequently, Alq3 with a thickness of 50 nm was vapor deposited on the electron transport layer 140 as the light emitting layer 150. Subsequently, α-NPD with a thickness of 50 nm was vapor deposited on the light emitting layer 150 as the hole transport layer 160.

Subsequently, $MoO_x$ with a thickness of 0.8 nm was vapor deposited on the hole transport layer 160 as the hole injection layer 170.

Next, the anode 180 was formed on the hole injection layer 170. Gold with a thickness of 10 nm and a width of 1 mm was vapor deposited as the anode on the glass substrate 110 on which the hole injection layer 170 was formed. The vacuum in the vapor deposition was about $8\times10^{-6}$ Pa. As the anode 180 transmits visible light, the light is extracted from the anode 180 (top electrode) side.

Here, the light emitting layer 150, the hole transport layer 160 and the hole injection layer 170 were formed using a metal mask to completely cover the cathode 120 and the electron transport layer 140. The anode 180 was formed using a metal mask to be orthogonal to the cathode 120. An overlapping area of 1 mm×1 mm, at which the anode 180 with a thickness of 1 mm that was vapor deposited to be orthogonal to the cathode 120 with a thickness of 1 mm, emits light when voltage is applied.

By the above steps, the organic EL device 200 including the glass substrate, the cathode composed of 2 mol % neodymium containing aluminum, the electron transport layer composed of the thin film of amorphous metal oxide, the light emitting layer composed of Alq3, the hole transport layer composed of α-NPD, the hole injection layer composed of $MoO_x$ and the anode composed of gold was manufactured.

(Evaluation of Characteristic of Organic EL Device)

Next, current and luminance of the obtained organic EL device 200 were measured by applying DC voltage. The measurement was performed by measuring the luminance and the current value upon applying a predetermined voltage between the cathode 120 and the anode 180 of the organic EL device 200 within a glove box purged of nitrogen. The luminance was measured using a luminance meter (BM-7A) manufactured by TOPCOM.

Figure 8:
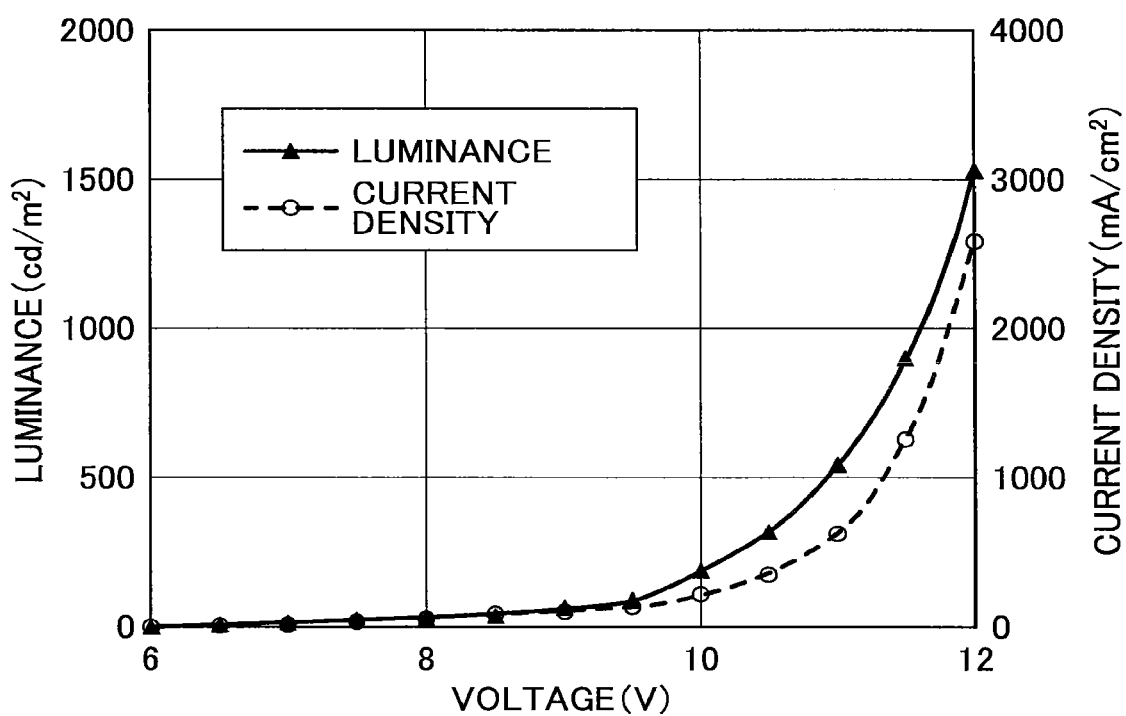
FIG. 8 is a graph illustrating a result of evaluation test of light-emission characteristics of an organic electroluminescent device 200.

FIG. 8 illustrates obtained current-voltage-luminance characteristic. The luminance and the current density of the organic EL device 200 increased from the voltage of 8 V, and the luminance was 1500 cd/m² and the current density was 2.6 A/cm² when the voltage was 12 V. From this result, it was confirmed that the thin film of amorphous metal oxide with a thickness of 100 nm can function as the electron transport layer.

Example 12

By the following method, an organic EL device 300 was manufactured, and its characteristic was evaluated. The organic EL device 300 had structure in which the cathode 120 was placed on the glass substrate 110 as a bottom electrode, and the electron injection layer 130, the electron transport layer 140, the light emitting layer 150, the hole transport layer 160, the hole injection layer 170 and the anode 180 as a top electrode were placed thereon in this order to extract light from the anode side. Here, the above numerals refer to FIG. 1. However, the organic electroluminescent device 100 is substituted for by the organic EL device 300.

Further, in Example 12, formation of the hole blocking layer 145 and the electron blocking layer 155 was omitted.

As a material of each of the layers, the cathode 120 was 2 mol % Nd containing aluminum, the electron injection layer 130 was LiF, the electron transport layer 140 was amorphous metal oxide, the light emitting layer 150 was Alq3, the hole transport layer 160 was α-NPD, the hole injection layer 170 was $MoO_x$, and the anode 180 was gold.

First, the glass substrate 110 was introduced in the chamber of the sputtering apparatus and the chamber was evacuated to $10^{-5}$ Pa. Next, 20 sccm of Ar as the sputtering gas was introduced and the pressure of the sputtering gas was 0.3 Pa. The 2 mol % Nd containing aluminum target was used as the target for the cathode, electric power of 100 W was applied to the puttering cathode to generate plasma and the cathode 120 was deposited by sputtering. The thickness was 80 nm.

Next, the glass substrate 110 on which the cathode 120 was formed was transferred to the vacuum vapor deposition chamber under vacuum without exposing to the air, and a LiF layer was deposited as the electron injection layer 130. The vacuum in the chamber was $10^{-6}$ Pa. The thickness of LiF was 0.5 nm.

Further, the glass substrate 110 on which the electron injection layer 130 was formed was returned to the chamber of the sputtering apparatus under vacuum. After exchanging the sputtering target to a sintered body of $ZnO/SiO_2$ (90/10 mol %), the thin film of amorphous metal oxide with a thickness of about 100 nm was deposited as the electron transport layer 140 on the cathode 120 and the electron injection layer 130. The temperature of the substrate temperature when depositing the film was less than or equal to 70° C.

The glass substrate 110 to which these depositions were performed was introduced to the vacuum evaporation chamber, and an Alq3 layer with a thickness of 30 nm was deposited as the light emitting layer 150. Subsequently, an α-NPD layer with a thickness of 30 nm was deposited as the hole transport layer 160. Further, a $MoO_x$ layer with a thickness of 0.8 nm was deposited as the hole injection layer 170.

Here, the LiF layer, the Alq3 layer, the α-NPD layer and the $MoO_x$ layer were formed as an area of 20 mm×20 mm using a metal mask to completely cover a portion of a light emitting area of the cathode except a portion that becomes a terminal portion. The vacuum in vapor deposition was about $8 \times 10^{-6}$ Pa.

Next, the anode 180 with a width of 1 mm was vapor deposited to be orthogonal to the cathode 120. This means that an area of 1 mm×1 mm at which the cathode 120 and the anode 180 overlap is an area through which current flows by applying voltage. A gold layer with a thickness of 10 nm was deposited as the anode 180.

By the above steps, the organic EL device 300 including the glass substrate, the cathode composed of 2 mol % neodymium containing aluminum, the electron injection layer composed of LiF, the electron transport layer composed of the thin film of amorphous metal oxide, the light emitting layer composed of Alq3, the hole transport layer composed of α-NPD, the hole injection layer composed of $MoO_x$ and the anode composed of gold was manufactured.

Example 13

An organic EL device 400 was manufactured by the method similar to Example 12, and its characteristic was evaluated. Here, although the electron transport layer composed of the thin film of amorphous metal oxide with a thickness of about 100 nm and the Alq3 layer with a thickness of 30 nm were formed in Example 12, Example 13 was different that the electron transport layer composed of the thin film of amorphous metal oxide was not formed and the light emitting layer also functioning as the electron transport layer composed of Alq3 with a thickness of 50 nm was formed.

This means that the organic EL device 400 including the glass substrate, the cathode composed of 2 mol % Nd containing aluminum with a thickness of 80 nm, the electron injection layer composed of LiF with a thickness of 0.5 nm, the electron transport layer also functioning as the light emitting layer composed of Alq3 with a thickness of 50 nm, the hole transport layer composed of α-NPD with a thickness of 30 nm, the hole injection layer composed of $MoO_x$ with a thickness of 0.8 nm and the anode composed of gold with a thickness of 10 nm was manufactured.

(Evaluation of Characteristics of Organic EL Devices)

The long term stability of the luminance of each of the organic EL devices 300 and 400 was evaluated by applying DC voltage. The measurement was performed by measuring the period when the luminance was reduced to half when flowing constant current between the cathode and the anode of each of the organic EL devices 300 and 400 within a glove box purged of nitrogen. The luminance was measured using a luminance meter (BM-7A) manufactured by TOPCOM. It was confirmed that the period when the luminance was reduced to half was significantly longer and the reliability was improved for the organic EL device 300 in which the thin film of amorphous metal oxide was used as the electron transport layer, compared with the organic EL device 400 in which Alq3 was used as the electron transport layer.

Example 14

The organic EL device 500 was manufactured by the similar method as Example 12, and its characteristic was evaluated. Here, although the layer composed of LiF with a thickness of 0.5 nm was formed as the electron injection layer in Example 12, Example 14 was different that the electride thin film with a thickness of about 2 nm was used as the electron injection layer.

In other words, similar to Example 12, the cathode 120 was formed on the glass substrate 110. Next, the glass substrate 110 with the cathode 120 was introduced in the sputtering deposition room, and the electride thin film was deposited on the cathode 120 as the electron injection layer 130.

The electride thin film was deposited using a target with a diameter of 2 inches composed of crystalline C12A7 electride whose electron density was $1.4 \times 10^{21}$ cm$^{-3}$ by a sputtering method. The atmosphere when sputtering was oxygen partial pressure of less than about $4.3 \times 10^{-7}$ Pa. The sputtering gas was Ar and the pressure of the sputtering gas was 0.5 Pa. The distance between the sample and the target (T-S distance) was 10 cm. Further, the electric power 50 W was applied to the sputtering cathode. The glass substrate was not actively heated. The thickness of the thin film of the obtained electride was about 2 nm.

After forming the electron injection layer 130, similar to Example 12, the electron transport layer 140 composed of the thin film of amorphous metal oxide, the light emitting layer 150 composed of Alq3, the hole transport layer 160 composed of α-NPD, the hole injection layer 170 composed of $MoO_x$ and the anode 180 were stacked.

After the above steps, the organic EL device 500 including the glass substrate, the cathode composed of 2 mol % neodymium containing aluminum, the electron injection layer composed of electride, the electron transport layer composed of the thin film of amorphous metal oxide, the light emitting layer composed of Alq3, the hole transport layer composed of α-NPD, the hole injection layer composed of $MoO_x$ and the anode composed of gold was manufactured.

Example 15

Next, by the method similar to Example 14, an organic EL device 600 was manufactured, and its characteristic was evaluated. Here, although the electron transport layer composed of the thin film of amorphous metal oxide with a thickness of about 100 nm and the Alq3 layer with a thickness of 30 nm were formed in Example 14, Example 15 is different in that the electron transport layer composed of the thin film of amorphous metal oxide was not formed and the light emitting layer also functioning as the electron transport layer composed of Alq3 with a thickness of 50 nm was formed.

This means that the organic EL device 600 including the glass substrate, the cathode composed of 2 mol % Nd containing aluminum with a thickness of 80 nm, the electron injection layer composed of an electride thin film with a thickness of 2 nm, the light emitting layer also functioning as the electron transport layer composed of Alq3 with a thickness of 50 nm, the hole transport layer composed of α-NPD with a thickness of 30 nm, a hole injection layer composed of $MoO_x$ with a thickness of 0.8 nm and the anode composed of gold with a thickness of 10 nm was manufactured.

(Evaluation of Characteristics of Organic EL Devices)

Next, current and luminance of each of the organic EL devices 500 and 600 were measured by applying DC voltage. The measurement was performed by measuring the luminance and the current upon applying a predetermined voltage between the cathode and the anode of each of the organic EL devices within a glove box purged of nitrogen. For the measurement of the luminance, a luminance meter (BM-7A) manufactured by TOPCOM was used. It was confirmed that the luminance per unit current was high and the current efficiency (cd/A) was improved for the organic EL device 500 in which the thin film of amorphous metal oxide was used as the electron transport layer, compared with the organic EL device 600 in which Alq3 was used as the electron transport layer (also functioning as the light emitting layer).

Example 21

A thin film of Zn—Si—O based amorphous metal oxide was formed on a substrate made of a silica glass by a sputtering method, and its characteristic was evaluated.

For the deposition, a sintered body having a composition of 85% and 15% molar ratio of ZnO and $SiO_2$, respectively, was used as a target. The sputtering gas was Ar, the pressure was 2 Pa, and the distance between the target and the substrate was 10 cm.

The obtained thin film of amorphous metal oxide was confirmed to be amorphous. Further, the electron mobility of the thin film obtained by Hall effect was 0.2 $cm^2/V/s$. The carrier density was $5\times10^{16}$ $m^{-3}$, and the electrical conductivity was $2\times10^{-3}$ S/cm. Further, the band gap obtained by the Tauc plot was 3.21 eV, and was transparent at a visible range.

Example 22

A thin film of metal oxide was formed on a substrate made of a silica glass by a sputtering method, and its characteristic was evaluated.

For the deposition, a sintered body having a composition of 85% and 15% molar ratio of ZnO and $SiO_2$, respectively, was used as a target. The sputtering gas was Ar, the pressure was 3 Pa and the distance between the target and the substrate was 10 cm.

The obtained thin film of metal oxide was confirmed to be amorphous. Further, the electron mobility of the thin film obtained by Hall effect was 1.4 $cm^2/V/s$. The carrier density was $4\times10^{16}$ $cm^{-3}$.

Results of the evaluation of characteristics of the thin films of Example 21 and Example 22 are illustrated in Table 3.

TABLE 3

| EXAMPLE | COMPOSITION OF TARGET (mol %) ZnO/$SiO_2$ | STATUS | ELECTRON MOBILITY ($cm^2/V/s$) | CARRIER DENSITY ($cm^{-3}$) | BAND GAP (eV) | ELECTRICAL CONDUCTIVITY (S/cm) |
|---|---|---|---|---|---|---|
| 21 | 85/15 | AMORPHOUS | 0.2 | $5\times10^{16}$ | 3.21 | $2\times10^{-3}$ |
| 22 | 85/15 | AMORPHOUS | 1.4 | $4\times10^{16}$ | — | — |

Example 31

By the following method, sample A that simulates an organic EL device was manufactured. Sample A includes a glass substrate, anode (ITO), an electron transport layer (thin film of amorphous metal oxide), an electron injection layer (LiF) and a cathode (Al: thickness of 80 nm) in this order.

First, an ITO layer (thickness of 100 nm) was deposited on an alkali-free glass substrate by a general sputtering method. Next, a thin film of amorphous metal oxide (thickness of 100 nm) was deposited on the ITO layer as the electron transport layer. Deposition conditions were the same as those of the above described Example 21.

Next, a LiF layer (thickness of 0.5 nm) was deposited on the thin film of amorphous metal oxide by a sputtering method. Next, an Al layer was deposited on the LiF layer by a resistance heating evaporation method. Ag granules were used as the vapor deposition source, and the deposition rate was 1.0 nm/second.

In both cases, the vacuum in the chamber was $2\times10^{-6}$ Pa.

Here, sample A is to measure electron transport characteristic, and thus, the light emitting layer, the hole transport layer and the hole injection layer were not formed.

By the similar method, sample B that simulates an organic EL device was manufactured.

Here, in the sample B, an Alq3 layer was used as the electron transport layer instead of the thin film of amorphous metal oxide. The Alq3 layer was deposited by the above described vacuum vapor deposition. Other layer structures are similar to those of sample A.

The electron transport characteristics were evaluated using manufactured samples A and B. The result is illustrated in FIG. 9.

Figure 9:
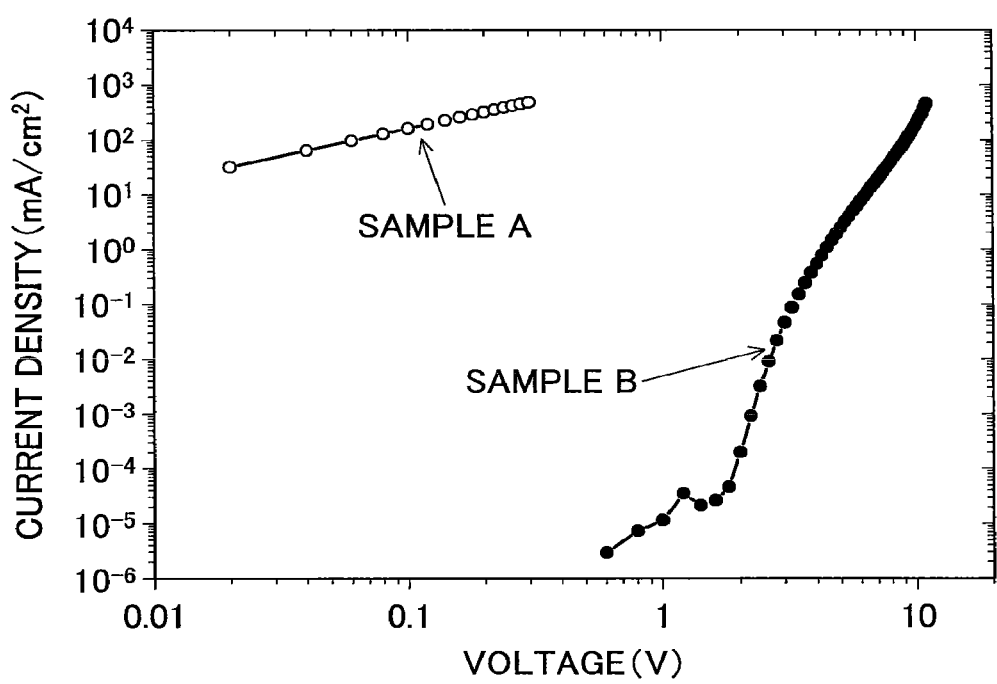
FIG. 9 is a graph illustrating current-voltage characteristics of samples A and B.

FIG. 9 illustrates current voltage characteristics of samples A and B.

As illustrated in FIG. 9, it can be understood that the current density is improved for each voltage for sample A, compared with sample B. As such, it was confirmed that the driving voltage of the organic EL device can be reduced by using Zn—Si—O based amorphous metal oxide as the electron transport layer.

Example 32

By the following method, joining characteristic between the thin film of amorphous metal oxide and the cathode material was evaluated. Here, as a cathode material, FTO and ITO which are generally used as an anode material were used in addition to Al metal.

First, by the method similar to Example 21, a thin film of amorphous metal oxide (thickness of 120 nm) was formed on the glass substrate. Next, an Al layer was formed on the thin film. The current-voltage characteristic was evaluated by a two-terminal method and a four-terminal method using obtained sample C-1.

As a result, it was revealed that the joining between the thin film of amorphous metal oxide and the Al layer in sample C-1 was an Ohmic junction.

Meanwhile, an FTO layer was formed on the glass substrate by atmospheric pressure CVD. Next, a thin film of amorphous metal oxide (thickness of 100 nm) was formed on the FTO layer by the method similar to Example 21. Further, a dot-like Al layer (1 mm×1 mm) was formed on the thin film of amorphous metal oxide to manufacture sample C-2.

It was revealed that an Ohmic junction was formed between the FTO layer and the thin film of amorphous metal oxide by evaluating current-voltage characteristic of sample C-2 using a contact prober.

By similarly evaluating for the ITO layer, it was confirmed that an Ohmic junction was formed between the ITO layer and the thin film of amorphous metal oxide.

Figure 10:
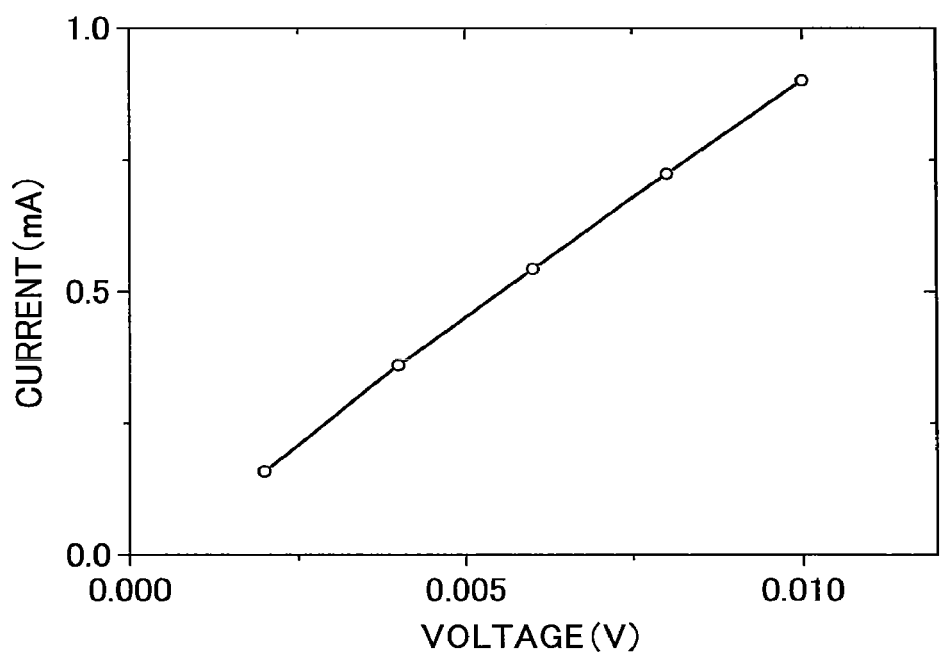
FIG. 10 is a graph illustrating a measured result of current-voltage characteristic obtained in sample C-2.

FIG. 10 illustrates a measurement result of current-voltage characteristic obtained for sample C-2 as an example.

With these results, it was revealed that good electron injection characteristic from the cathode to the electron transport layer was obtained when the thin film of amorphous metal oxide was used as the electron transport layer.

Generally, it is known that, when an Alq3 layer is used as the electron transport layer, an Ohmic junction cannot be formed between the electron transport layer and the cathode material without providing an electron injection layer between the Alq3 layer and the cathode material.

On the other hand, as is indicated by the above results, when the thin film of amorphous metal oxide is used as the electron transport layer, an Ohmic junction can be formed between the electron transport layer and the cathode material without providing an electron injection layer therebetween. Thus, when the thin film of amorphous metal oxide is used as the electron transport layer, the driving voltage of the organic EL device can be reduced. Further, the manufacturing process of the organic EL device can be simplified.

Here, from this experiment, it was confirmed that FTO and ITO, which are generally used as an anode material, can be used as a cathode material.

Example 33

By the following method, sample D that simulates an organic EL device was manufactured. The sample D includes a glass substrate, an anode (ITO), an electron transport layer (thin film of amorphous metal oxide), a light emitting layer (CBP+Ir(ppy)$_3$), a hole transport layer (α-NPD), a hole injection layer (MoO$_x$) and a cathode (Ag) in this order.

First, an ITO layer (thickness of 100 nm) was deposited on an alkali-free glass substrate by a general sputtering method. Next, a thin film of Zn—Si—O based amorphous metal oxide (thickness of 50 nm) was deposited on the ITO layer as the electron transport layer. Deposition conditions were the same as those of the above described Example 21.

Next, a CBP+Ir(ppy)$_3$ layer (thickness of 35 nm) was deposited on the thin film of amorphous metal oxide by vapor deposition. CBP powders added in a first crucible made of molybdenum and Ir(ppy)$_3$ powders added in a second crucible were used as the vapor deposition source, and the two materials were co-vapor deposited such that Ir(ppy)$_3$ was 6 wt %. The deposition rate was 0.1 nm/second.

Next, an α-NPD layer (thickness of 40 nm) was deposited on the light emitting layer by a resistance heating evaporation method. NPD powders added in a crucible made of molybdenum were used as the vapor deposition source, and the deposition rate was 0.1 nm/second.

Next, a MoO$_x$ layer (thickness of 0.8 nm) was formed on the α-NPD layer by a resistance heating evaporation method. MoO$_3$ powders were used as the vapor deposition source, and the deposition rate was 0.1 nm/second.

Next, an Ag layer (thickness of 80 nm) was deposited on the MoO$_x$ layer by a resistance heating evaporation method. Ag granules were used as the vapor deposition source, and the deposition rate was 1.0 nm/second.

In both cases, the vacuum in the chamber was $2\times10^{-6}$ Pa.

By the similar method, sample E that simulates an organic EL device was manufactured.

Here, in sample E, an Alq3 layer (thickness of 50 nm) was used as the electron transport layer instead of the thin film of amorphous metal oxide. The Alq3 layer was deposited by the above described vacuum vapor deposition. Structures of other layers were the same as those of sample D.

Luminance characteristics were evaluated using the manufactured samples D and E. The result is illustrated in FIG. 11.

Figure 11:
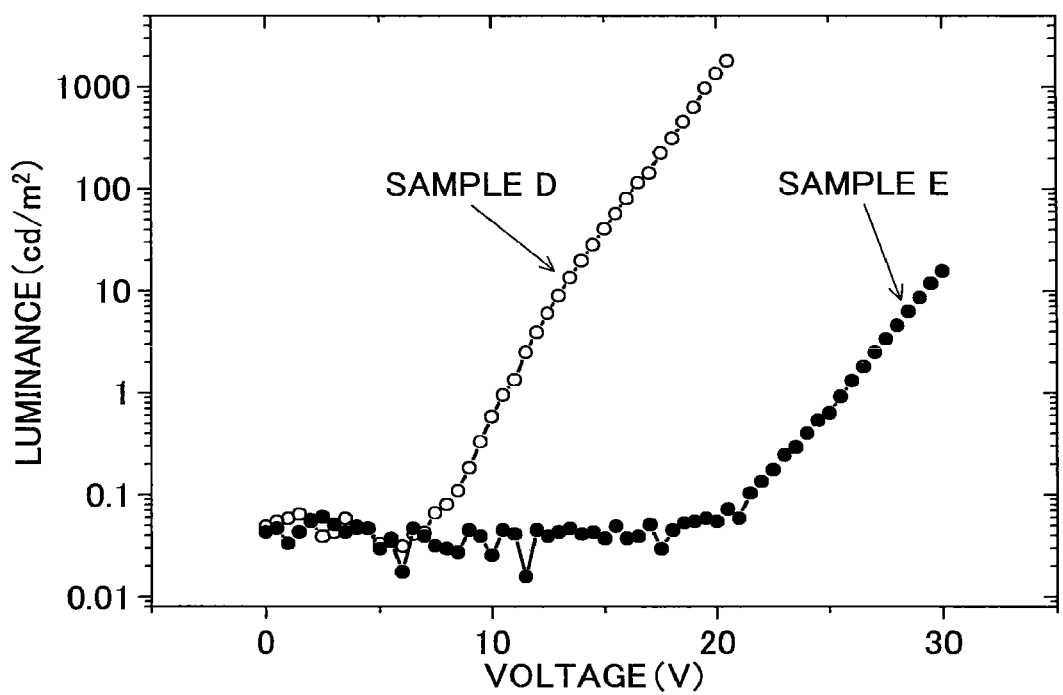
FIG. 11 is a graph illustrating luminance-voltage characteristics of samples D and E.

FIG. 11 illustrates luminance-voltage characteristics of samples D and E. From this figure, it can be understood that the driving voltage, when the luminance of 10 cd/m$^2$ is obtained, is about 13 V for sample D, and the driving voltage, when the same luminance is obtained, is about 29 V for sample E.

As such, it was confirmed that the driving voltage can be significantly reduced for the organic EL device in which Zn—Si—O based amorphous metal oxide was used as the electron transport layer.

Example 34

By the following method, sample F that simulates an organic EL device was manufactured. The sample F includes a glass substrate, a cathode (ITO), an electron transport layer (thin film of amorphous metal oxide), a light emitting layer (Alq3), a hole transport layer (α-NPD), a hole injection layer (MoO$_x$) and an anode (Ag) in this order.

First, an ITO layer (thickness of 100 nm) was deposited on an alkali-free glass substrate by a general sputtering method. Next, a thin film of Zn—Si—O based amorphous metal oxide (thickness of 50 nm) was deposited on the ITO layer as the electron transport layer. Deposition conditions were the same as those of the above described Example 22.

Next, an Alq3 layer (thickness of 50 nm) was formed on the thin film of amorphous metal oxide as the light emitting layer. The Alq3 layer was deposited by the above described vacuum vapor deposition.

Next, an α-NPD layer (thickness of 450 nm) was deposited on the light emitting layer by a resistance heating evaporation method. NPD powders added in a crucible made of molybdenum were used as the vapor deposition source, and the deposition rate was 0.1 nm/second.

Next, a MoO$_x$ layer (thickness of 5 nm) was formed on the α-NPD layer by a resistance heating evaporation method. MoO$_3$ powders were used as the vapor deposition source, and the deposition rate was 0.1 nm/second.

Next, an Ag layer (thickness of 80 nm) was deposited on the MoO$_x$ layer by a resistance heating evaporation method.

Ag granules were used as the vapor deposition source, and the deposition rate was 1.0 nm/second.

In both cases, the vacuum in the chamber was $2\times10^{-6}$ Pa.

Luminance characteristic was evaluated using the obtained sample F. The result is illustrated in FIG. 12.

Figure 12:
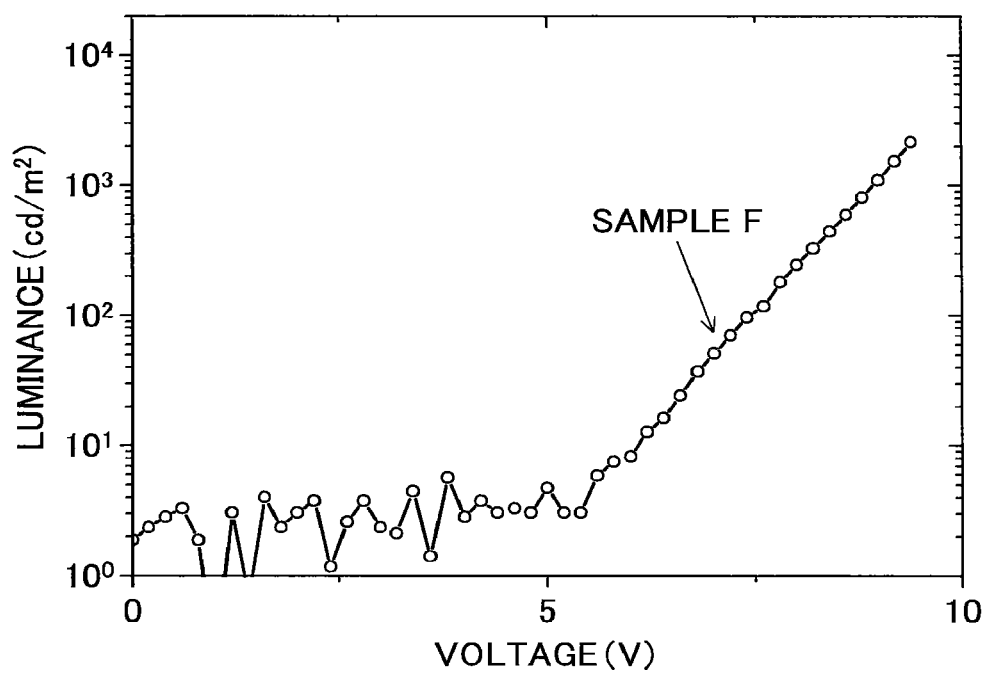
FIG. 12 is a graph illustrating luminance-voltage characteristic of sample F.

FIG. 12 illustrates luminance-voltage characteristic of sample F. From this figure, it can be understood that the driving voltage, when the luminance of 10 cd/m$^2$ is obtained, is about 6.1 V for sample F, and it is sufficiently low.

As such, it was confirmed that the driving voltage can be significantly reduced for the organic EL device in which the Zn—Si—O based amorphous metal oxide was used as the electron transport layer.

Example 35

By the following method, sample G that simulates an organic EL device was manufactured. The sample G includes a glass substrate, a cathode (ITO), an electron transport layer (thin film of amorphous metal oxide), an electron injection layer (thin film of amorphous C12A7 electride), a light emitting layer (Alq3), a hole transport layer (α-NPD), a hole injection layer (MoO$_x$) and an anode (Ag) in this order.

First, an ITO layer (thickness of 100 nm) was deposited on an alkali-free glass substrate by a general sputtering method. Next, a thin film of Zn—Si—O based amorphous metal oxide (thickness of 100 nm) was deposited on the ITO layer as an electron transport layer. Deposition conditions were the same as those of the above described Example 21.

Next, a thin film of amorphous C12A7 electride (thickness of 4 nm) was formed on the thin film of amorphous metal oxide.

The thin film was formed by a sputtering method. A crystalline C12A7 electride sintered body of 72 mm×72 mm was used as a target. A facing targets sputtering apparatus was used for deposition, the argon gas pressure was 0.1 Pa and the RF power was 100 W.

Next, an Alq3 layer (thickness of 50 nm) was deposited on the thin film of amorphous C12A7 electride as a light emitting layer. The Alq3 layer was deposited by the above described vacuum vapor deposition.

Next, an α-NPD layer (thickness of 50 nm) was deposited on the light emitting layer by a resistance heating evaporation method. NPD powders added in a crucible made of molybdenum were used as the vapor deposition source, and the deposition rate was 0.1 nm/second.

Next, a MoO$_x$ layer (thickness of 5 nm) was deposited on the α-NPD layer by a resistance heating evaporation method. MoO$_3$ powders were used as the vapor deposition source, and the deposition rate was 0.1 nm/second.

Next, an Ag layer (thickness of 80 nm) was deposited on the MoO$_x$ layer by a resistance heating evaporation method. Ag granules were used as the vapor deposition source, and the deposition rate was 1.0 nm/second.

In both cases, the vacuum in the chamber was $2\times10^{-6}$ Pa.

Luminance characteristic was evaluated using the obtained sample G. The result is illustrated in FIG. 13.

Figure 13:
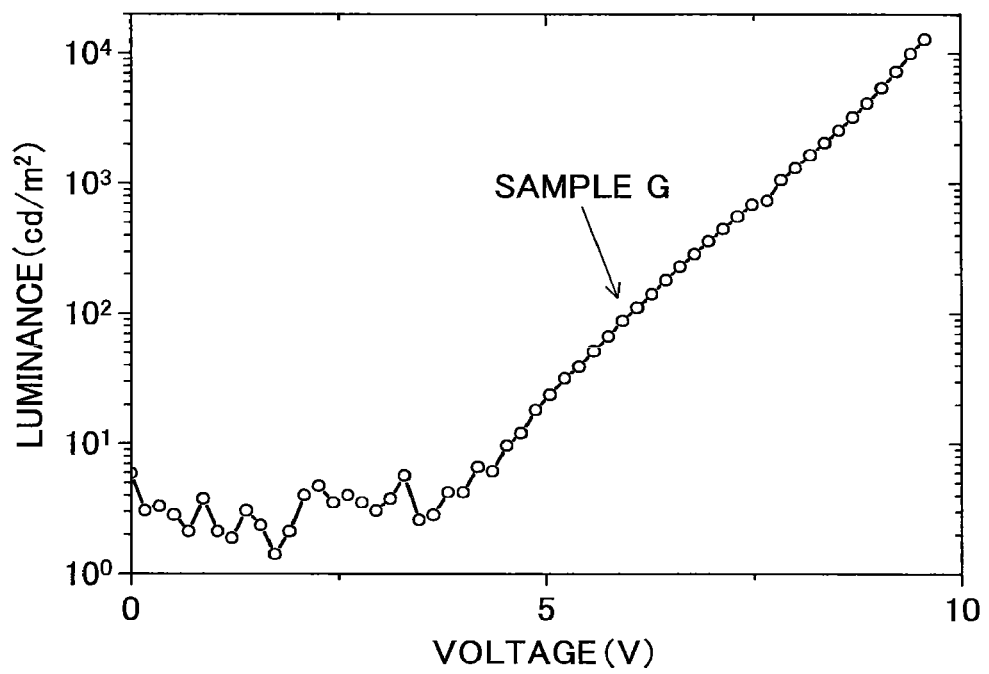
FIG. 13 is a graph illustrating luminance-voltage characteristic of sample G.

FIG. 13 illustrates luminance-voltage characteristic of sample G. From this figure, it can be understood that the driving voltage, when the luminance of 10 cd/m$^2$ is obtained, is about 5.2 V for sample G, and it is sufficiently low.

As such, it was confirmed that the driving voltage can be significantly reduced for the organic EL device in which Zn—Si—O based amorphous metal oxide was used as the electron transport layer.

Example 36

By the following method, samples H to M, each simulating an organic EL device, were manufactured. For these samples, electrons are injected from the cathode, however, these samples were structured such that holes are not easily injected from the anode. Thus, easiness in flowing of electrons was evaluated. The structure of each of the samples is described in the following.

Sample H includes a glass substrate, a cathode (ITO, thickness of 100 nm), an electron transport layer (thin film of Zn—Si—O based amorphous metal oxide, thickness of 40 nm), a hole blocking layer also functioning as an electron injection layer (thin film of amorphous C12A7 electride, thickness of 4 nm), an electron transport layer (Alq3, thickness of 160 nm), a hole blocking layer (BCP, thickness of 20 nm) and an anode (Al, thickness of 100 nm) in this order.

Sample I includes a glass substrate, an anode (Al, thickness of 80 nm), a hole blocking layer (BCP, thickness of 20 nm), an electron transport layer (Alq3, thickness of 160 nm), an electron injection layer (LiF, thickness of 0.5 nm) and a cathode (Al, thickness of 80 nm) in this order.

Sample J includes a glass substrate, a cathode (Al, thickness of 80 nm), an electron injection layer (LiF, thickness of 0.5 nm), an electron transport layer (Alq3, thickness of 160 nm), a hole blocking layer (BCP, thickness of 20 nm) and an anode (Al, thickness of 80 nm) in this order.

Sample K includes a glass substrate, a cathode (ITO, thickness of 100 nm), an electron transport layer (Alq3, thickness of 160 nm), a hole blocking layer (BCP, thickness of 20 nm) and an anode (Al, thickness of 100 nm) in this order.

Sample L includes a glass substrate, an anode (Al, thickness of 80 nm), a hole blocking layer (BCP, thickness of 20 nm), an electron transport layer (Alq3, thickness of 160 nm) and a cathode (Al, thickness of 80 nm) in this order.

Sample M includes a glass substrate, a cathode (Al, thickness of 80 nm), an electron transport layer (Alq3, 160 nm), a hole blocking layer (BCP, 20 nm) and an anode (Al, 80 nm) in this order.

The deposition method for each of the layers is described in the following.

For ITO in samples H and K, FLAT ITO manufactured by GEOMATEC Co., Ltd. was used in which the specific resistance was 140 μΩ·cm.

For the thin film of amorphous metal oxide in sample H, a sintered body with a diameter of 7.6 mm (3 inches) containing ZnO and SiO$_2$, molar ratio of 80% and 20%, was used as a sputtering target. After evacuating the chamber to be $5\times10^{-7}$ Pa using a cryo-pump, 0.25% of O$_2$ and 99.75% of Ar were introduced as sputtering gas. The distance between the target and the substrate was 10 cm and the film was deposited by an RF magnetron sputtering method. The pressure was 0.4 Pa. The RF power was 100 W.

The thin film of amorphous C12A7 electride of sample H was deposited by a facing targets sputtering method using a sintered body of polycrystalline C12A7 electride with an electron density of $1.4\times10^{21}$ cm$^{-3}$ as a sputtering target. The size of the sintered body was 85 mm×85 mm×4 mm (thickness). After the chamber was evacuated to be $5\times10^{-5}$ Pa by a turbo-pump, 100% Ar was introduced as sputtering gas. The substrate was placed to be orthogonal to the facing targets, and the distance between a lower end of the target and the substrate was 1.7 cm. The pressure was 0.1 Pa.

Alq3 and BCP of samples H to M were deposited by vacuum vapor deposition after evacuating the chamber to $5 \times 10^{-6}$ Pa by a cryo-pump. The deposition rate was 0.1 nm/second.

Al of samples H to M was deposited by vacuum vapor deposition after evacuating the chamber to $5 \times 10^{-6}$ Pa by a cryo-pump. The deposition rate was 1 nm/second.

LiF of samples I and J was deposited by vacuum vapor deposition after evacuating the chamber to $5 \times 10^{-6}$ Pa by a cryo-pump. The deposition rate was 0.1 nm/second.

Figure 14:
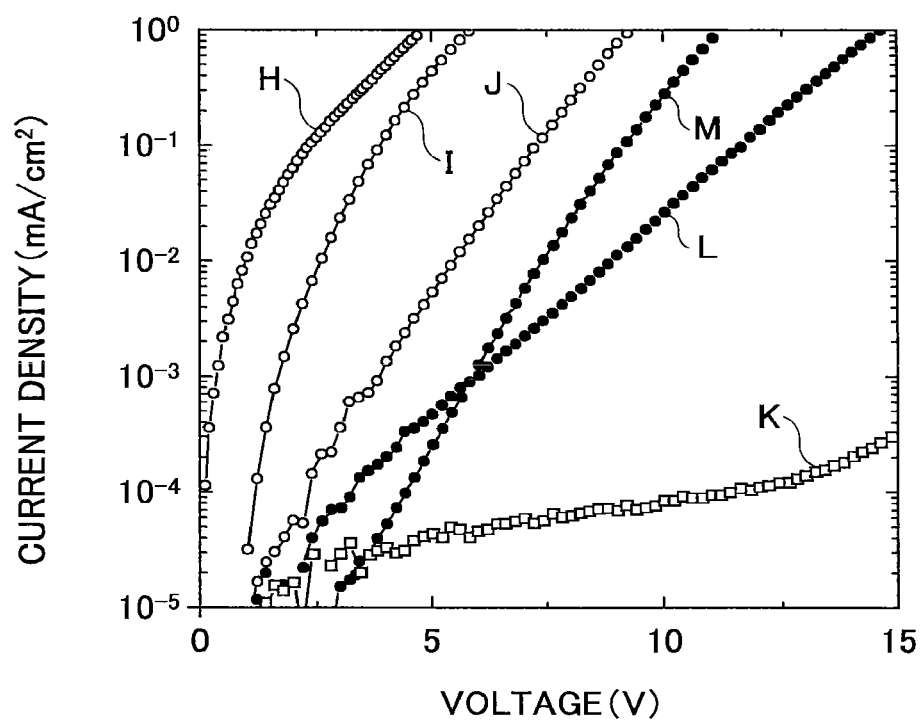
FIG. 14 is a graph illustrating current density-voltage characteristics of samples H to M.

Current density-voltage characteristics of obtained samples H to M are illustrated in FIG. 14. Ascending order of voltage when 0.2 $\mu A/cm^2$ is sample H, sample I, sample J, sample L, sample M and sample K, and it can be understood that electrons can flow easiest for the structure of sample H.

Conventionally, for the structure (sample J) in which the electrode at the substrate side is the cathode and LiF is vapor deposited as the electron injection layer, it is difficult to flow electrons compared with the structure (sample I) in which LiF is vapor deposited on the organic layer as the electron injection layer. However, by configuring the structure (sample H) in which the thin film of Zn—Si—O based amorphous metal oxide and the thin film of amorphous C12A7 electride are deposited on ITO by sputtering, even for the structure in which the electrode at the substrate side is the cathode, the electrons can be easily flow compared with the structure in which the electron injection layer and the cathode are provided on the organic layer.

The thin film of metal oxide of the invention may be adapted to an organic device such as an organic electroluminescent device, an organic photovoltaic cell or the like. The organic electroluminescent device may be a tandem structure in which a plurality of light emitting layers are connected by an intermediate layer. The photovoltaic cell may be an organic photovoltaic cell or an inorganic photovoltaic cell, and may be a tandem structure in which a plurality of photoelectric conversion layers are connected and stacked.

The organic electroluminescent device of the invention may be used as a display device of a display apparatus. The display apparatus including the organic electroluminescent device of the invention may be adapted to various electron devices. For example, the organic electroluminescent device of the invention may be incorporated in a display unit of a display device such as a television or the like, an imaging device such as a digital camera or the like, a digital data processing apparatus such as a computer or the like, a mobile terminal device such as a mobile phone or the like as a display apparatus. Further, the organic electroluminescent device of the invention may be incorporated in a display unit in a vehicle, a display unit of a car navigation device or the like.

The display apparatus including the organic electroluminescent device of the invention may be provided in a window, a door, a ceiling, a floor, a wall, a partition or the like of an architectural structure or a mobile body (a vehicle, an aircraft, a ship or the like). Further, the display apparatus may be included in a public transportation vehicle, an advertising board in town, an advertising tower or the like as an advertisement display apparatus. The organic electroluminescent device may be used as a light source of an illumination apparatus, or a light source of a display apparatus.

NUMERALS

100 organic electroluminescent device
110 substrate
120 cathode
130 electron injection layer
140 electron transport layer
145 hole blocking layer
150 light emitting layer
155 electron blocking layer
160 hole transport layer
170 hole injection layer
180 anode

What is claimed is:

1. A thin film of metal oxide, comprising:
zinc (Zn);
silicon (Si);
oxygen (O); and
one or more other metal components selected from the group consisting of tin (Sn), titanium (Ti), indium (In), gallium (Ga), and niobium (Nb),
wherein the film does not comprise aluminum (Al),
wherein the atomic ratio of Zn/(Zn+Si) is 0.80 to 0.92,
wherein a refraction index of the thin film is 1.50 to 2.00,
wherein the metal oxide of the thin film is amorphous, and
wherein the content of the one or more other metal components, in terms of an oxide, is less than or equal to 15 mol % with respect 100 mol %, which is the total of ZnO, $SiO_2$, and oxides of the one or more other metal components.

2. The film of claim 1, which is an electron transport capability film.

3. An organic electroluminescent device, comprising:
the film of claim 1.

4. The device of claim 3, further comprising:
a light emitting layer between an anode and a cathode,
wherein the thin film is provided between the light emitting layer and the cathode.

5. The device of claim 4, wherein the thin film is one or more layers selected from an electron transport layer, an electron injection layer, and a hole blocking layer.

6. The device of claim 4, wherein the thickness of the thin film is 70 nm to 2000 nm.

7. The device of claim 4, further comprising:
an electron injection layer constituted of one or more substances selected from a group consisting of lithium fluoride, cesium carbonate, sodium chloride, cesium fluoride, lithium oxide, barium oxide, barium carbonate, and (8-quinolinolato)lithium.

8. The device of claim 4, wherein the thin film directly contacts the cathode.

9. A photovoltaic cell, comprising:
the film of claim 1.

10. The cell of claim 9, wherein the thin film is one or more layers selected from an electron transport layer, an electron injection layer, and a hole blocking layer.

11. An organic photovoltaic cell, comprising:
the film of claim 1.

12. The cell of claim 11, wherein the thin film is one or more layers selected from an electron transport layer, an electron injection layer and a hole blocking layer.

13. A thin film of metal oxide, comprising:
zinc (Zn);
silicon (Si);
oxygen (O); and
a further metal component,
wherein the film does not comprise aluminum (Al),
wherein the atomic ratio of Zn/(Zn+Si) is 0.80 to 0.92,
wherein a refraction index of the thin film is 1.50 to 2.00,
wherein the metal oxide of the thin film is amorphous, and wherein the content of the one or more other metal components, in terms of an oxide, is less than or equal to 15 mol % with respect 100 mol %, which is the total of ZnO, SiO$_2$, and oxides of the one or more other metal components.

14. The film of claim 13, wherein further metal component comprises a first metal and a second metal.

15. An organic electroluminescent device, comprising: the film of claim 13.

16. The device of claim 3, comprising no electron injection layer.

17. The device of claim 15, comprising no electron injection layer.

18. A thin film of metal oxide, comprising:
zinc (Zn);
silicon (Si);
oxygen (O); and
tin (Sn), titanium (Ti) indium (In), gallium (Ga), and/or niobium (Nb),
wherein the film does not comprise aluminum (Al),
wherein the atomic ratio of Zn/(Zn+Si) is 0.80 to 0.95,
wherein a refraction index of the thin film is 1.50 to 2.00,
wherein the metal oxide of the thin film is amorphous, and
wherein the content of the one or more other metal components, in terms of an oxide, is less than or equal to 15 mol % with respect 100 mol %, which is the total of ZnO, SiO$_2$, and oxides of the one or more other metal components.

19. The film of claim 13, comprising the tin (Sn).

20. The film of claim 13, comprising the titanium (Ti).

21. The film of claim 1, wherein a root mean square roughness for a measurement range of a 20 μm square of the thin film is less than or equal to 10 nm.

22. The film of claim 21, wherein an array of atoms in a crystallite in the metal oxide of the thin film is less than or equal to 16 lines.

23. The film of claim 13, wherein a root mean square roughness for a measurement range of a 20 μm square of the thin film is less than or equal to 10 nm.

24. The film of claim 23, wherein an array of atoms in a crystallite in the metal oxide of the thin film is less than or equal to 16 lines.

25. The film of claim 18, wherein a root mean square roughness for a measurement range of a 20 μm square of the thin film is less than or equal to 10 nm.

26. The film of claim 25, wherein an array of atoms in a crystallite in the metal oxide of the thin film is less than or equal to 16 lines.

* * * * *